(12) United States Patent  
Matsumoto

(10) Patent No.: US 7,884,505 B2  
(45) Date of Patent: Feb. 8, 2011

(54) DRY-TYPE HIGH-VOLTAGE LOAD SYSTEM APPARATUS AND METHOD OF PREVENTING CHAIN BREAKING AND ARC DISCHARGE FOR USE THEREWITH

(75) Inventor: Kesafumi Matsumoto, Atsugi (JP)

(73) Assignee: Kouken Company, Limited, Atsugi-shi (JP)

(*) Notice: Subject to any disclaimer, the term of this patent is extended or adjusted under 35 U.S.C. 154(b) by 86 days.

(21) Appl. No.: 12/386,272

(22) Filed: Apr. 16, 2009

(65) Prior Publication Data

US 2009/0289656 A1 Nov. 26, 2009

Related U.S. Application Data

(62) Division of application No. 10/516,660, filed as application No. PCT/JP2004/005171 on Dec. 1, 2004, now Pat. No. 7,535,126.

(30) Foreign Application Priority Data

Jul. 8, 2003 (JP) ............................... 2003-193358

(51) Int. Cl.  
  *G01R 31/00* (2006.01)
(52) U.S. Cl. ..................................... 307/112
(58) Field of Classification Search ............... None  
  See application file for complete search history.

(56) References Cited

U.S. PATENT DOCUMENTS

| | | | |
|---|---|---|---|
| 3,578,952 A | 5/1971 | Boose | |
| 4,072,847 A | 2/1978 | Craven | |
| 4,621,251 A | 11/1986 | Keefe | |
| 5,281,908 A | 1/1994 | Kondo | |
| 6,034,354 A | 3/2000 | Hironaka | |
| 7,019,269 B2 | 3/2006 | Okuda | |
| 7,218,201 B2 | 5/2007 | Matsumoto | |
| 2010/0039212 A1* | 2/2010 | Matsumoto | 338/260 |

FOREIGN PATENT DOCUMENTS

| | | |
|---|---|---|
| EP | 1 156 342 | 11/2001 |
| JP | 57-183701 | 11/1982 |
| JP | 1-74569 | 5/1989 |
| JP | 6-34725 | 2/1994 |

(Continued)

*Primary Examiner*—Jared J Fureman  
*Assistant Examiner*—Adi Amrany  
(74) *Attorney, Agent, or Firm*—Jordan and Hamburg LLP

(57) ABSTRACT

A dry-type high-voltage load system apparatus has a space-saving structure, which is resistant to chain breaking, arc discharge and vibration, and a method of preventing the chain breaking and the arc discharge for use with the system apparatus. The system apparatus includes a dry-type high-voltage load system circuit including a low-voltage bank formed of lower-capacity configuration banks which include three-phase resistor circuits which are low-voltage resistor circuit. A high-voltage bank includes lower-capacity configuration banks for a high-voltage resistor circuit formed of three-phase resistor circuits. The three-phase resistor circuits are connected to a high-voltage power generator in parallel and arein the form of a Y-connection of three resistor arrays so that an isolated and independent neutral point is unconnected to other neutral points. The three phase resistor circuits may also be in the form of a Δ-connection.

16 Claims, 21 Drawing Sheets

FOREIGN PATENT DOCUMENTS

| | | |
|---|---|---|
| JP | 7-43436 | 2/1995 |
| JP | 9-15307 | 1/1997 |
| JP | 9-15308 | 1/1997 |
| JP | 9-15309 | 1/1997 |
| JP | 2000-19231 | 1/2000 |
| WO | WO 01/40817 | 6/2001 |

* cited by examiner

PRIOR ART

PRIOR ART

PRIOR ART

PRIOR ART

PRIOR ART

PRIOR ART

US 7,884,505 B2

DRY-TYPE HIGH-VOLTAGE LOAD SYSTEM APPARATUS AND METHOD OF PREVENTING CHAIN BREAKING AND ARC DISCHARGE FOR USE THEREWITH

REFERENCE TO RELATED APPLICATION

This is a divisional application of Ser. No. 10/516,660, filed Dec. 1, 2004 which has presently issued as U.S. Pat. No. 7,535,126 on May 19, 2010. The subject matter of the aforementioned prior application is hereby incorporated herein by reference.

TECHNICAL FIELD

The present invention relates to a dry-type high-voltage load system apparatus mainly used in load characteristic tests of high-voltage power generator and a method of preventing chain breaking and arc discharge in the apparatus.

BACKGROUND ART

Heretofore, the three-phase alternating current generator winding and load connection used conventionally and generally Y-connection in high-voltage circuits, Δ-connection in low-voltage circuits and combinations of Y-delta or delta-Y in higher harmonic processing circuits.

Incidentally, the method used for a high-voltage resistor circuit for this type of dry-type high-voltage resistor circuit consisted of connecting in parallel a plurality of three-phase resistor circuits consisting of Y-connection of resistor array phases in which approximately ten high-voltage resistor elements such as those having a dielectric strength of 2,000V for 1 minute at a rated voltage of 400V are connected in series to address to the working voltage of 6,600V for adjusting power consumption, of arranging approximately one hundred and fifty resistor elements of one electric phase in a vertical rectangular frame box and cooling the group of resistor elements by an air blower to radiate heat. And the typical examples are disclosed in the following patent documents.

Japanese Patent Laid-open No. 6-34725
Japanese Patent Laid-open No. 7-43436
Japanese Patent Laid-open No. 9-15307
Japanese Patent Laid-open No. 9-15308
Japanese Patent Laid-open No. 9-15309
Japanese Patent Laid-open No. 2000-19231

Specifically, traditionally a high-voltage resistor apparatus used in load characteristic tests of high-voltage generating systems including resistor elements 1 having a fin 9 shown in FIG. 15 has been used. Additional information regarding this figure is that 2' is an outer tube in a cylindrical shape, which is formed to be approximately 1 m long.

And numeral 3 denotes a resistive heat-generating wire; numeral 4 an electrode rod, and numeral 5' an insulating material filling up the space between the resistive heat-generating wire 3, electrode rod 4 and the internal wall of the outer tube 2' and sealed with an end sealing member 6. This insulating material 5' is powdery and has a function of insulating the outer tube 2' and the resistive heat-generating wire 3 with the electrode rod 4.

Numeral 7 denotes a connection terminal fixed on both sides by nuts 8, 8 inserted on an outer end threaded portion 4a of the electrode rod 4. The resistor element 1' is further connected with the other adjoining resistor elements 1' through this connection terminal 7. Numeral 9 denotes a fin as described above and plays the role of a radiating plate that radiates heat generated when the resistive heat-generating wire 3 is supplied with power. The fin 9 is spirally integrally molded with or fixed on the sheath in the longitudinal direction on the periphery at intervals of approximately 7 mm.

This resistor element 1' is made to a specification of dielectric strength 2,000 V for 1 minute at a rated voltage of 400 V to address to a working voltage of 6,600 V.

FIG. 16 shows one phase resistor array 10' consisting of the resistor elements 1' connected in series. Numeral 11 denotes a connection member which connects the adjoining resistor elements 1' in the place of the connection terminal 7. Numeral 12' denotes a rectangular frame box being disassembable. The arrangement board 12a' of the rectangular frame box 12' holds ten resistor elements 1', the both ends of which penetratingly bridge the arrangement board 12a' and constitute a resistor array 10'. Three phases of the resistor array 10' are Y-connected to constitute the three-phase resistor circuit described below.

FIG. 17 shows a schematic structure of the high-voltage resistor apparatus γa'. The high-voltage resistor apparatus γa' houses vertically fifteen multiple stages of the resistor array 10' described above bridging, and five three-phase resistor circuits 17 are combined in parallel to form a lower-capacity configuration bank 13' constituting a lower-capacity high-voltage resistor circuit βa'.

At this time, adjoining upper and lower horizontal stages of resistor elements 1' are staggered so that the fins 9 of the resistor elements 1' may not overlap mutually. This is because airstream cooling from below by the cooling fan described below must be carried out evenly all over the entire space due to quite a high temperature that results from various resistor elements being activated with power switched on.

In the figure, numeral 15 denotes a first terminal plate. It is connected with the input line 16 from the high-voltage generating system to be tested, and also connected by the connecting line 18 with one end three-phase of the three-phase resistor circuit 17 of each Y-connection that had been bridge connected in multiple stages. Numeral 19 denotes a second terminal plate that serves as the common neutral point connecting all the three-phase resistor circuits 17 of each Y-connection with connecting lines 20 so that the other end of the three-phase resistor circuit 17 of each Y-connection may be zero phase.

An embodiment wherein the lower-capacity configuration bank 13' bridge held in the rectangular frame box 12' includes the cooling fan 14' described above is shown in FIG. 18. In the figure, numeral 21 denotes a vibration-proof rubber, and numeral 22 an insulator for insulating the rectangular frame box 12' from the fixing frame F (see FIG. 17). The addition of this insulator 22 works to further enhance the insulation of the whole rectangular frame box 12'. In the figure, numeral 23 denotes a hood, and 24' an air blower.

And the dry-type high-voltage load system circuit ε' of FIG. 19 shown in Japanese Patent Laid-open No. 5-215825 is constituted by a high-voltage resistor apparatus γa1'-γan' with an air blower 24' constituted by a plurality of lower-capacity configuration banks 13' and a variable low-voltage resistor apparatus 26 having an air blower 24' constituted by lower-capacity configuration banks 13' through a transformer 25 are connected in parallel with a high-voltage power generator G, and the lower-capacity high-voltage resistor circuit βa' having an air blower 24' is constituted by lower-capacity configuration banks 13' each having an air blower 24' bridge held in each rectangular frame box 12'.

Accordingly, when dry-type high-voltage load system apparatuses δ' are loaded on the loading platform 27a of an autotruck 27 shown in FIG. 20(a) and FIG. 20(b), the number of resistor elements 1' is limited for the dimensions of the rectangular frame box 12' because resistor elements 1 each having a bulky fin 9 are bridge held, and as a result we were forced to divide the apparatus into a plurality of lower-capacity configuration banks 13' (eleven units in the figure). And as a natural consequence the dimensions of the autotruck 27 had to be made larger. In FIG. 19, numeral 28 denotes a load switching portion, βb' a lower-capacity low-voltage resistor circuit, and in FIG. 20(*a*), 29 a control room, and 30 an appliance room.

As a result of load characteristic tests conducted in a high-voltage power generator G by using a large number of conventional dry lower-capacity configuration banks 13' divided into small lots, the temperature of air-cooled lower-capacity configuration banks soared as high as 140 degrees C., and it was found that individual units of resistor elements 1' had a temperature ranging from 350 degrees C. to 700 degrees C.

This is because, although the fins 9 of the resistor elements 1' for a high-voltage use arranged in the resistor array 10' are staggered to avoid their overlapping in the vertical direction, the shape of this fin 9 impedes the circulation of air generated by the air blower 24', and heat accumulates within the rectangular frame box 12' canceling the cooling action of the cooling fan 14'. The fin 9 the presence of which is considered as a common sense in this high-voltage resistor element 1' for the high-voltage use is very effective in low-voltage resistor elements. However, it has not been clearly understood that it causes various disadvantages stated below.

Specifically, the fin 9 that impedes the circulation of air causes air turbulence or disrupts the circulation of air within the rectangular frame box constituted by lower-capacity configuration banks 13' of the high-voltage resistor apparatus γa. As a result, the phenomenon of causing vibrations cannot be avoided, and in the conventional embodiment shown in FIG. 18, vibration-proof rubbers 21 are used to avoid the transmission of vibrations to the fixture frame F of the rectangular frame box 12'. However, the rectangular frame box 12' itself keeps on vibrating and the risk cannot be wiped out during tests.

Moreover, as the insulating material 5' contained in the outer tube 2' of the resistor element 1 is powdery, it is impossible to coat evenly because the insulating material moves and concentrates on one side due to external vibration, and the resulting partially inadequate insulation not only triggered dielectric breakdown, but also the powdery insulating material led to many shortcomings such as causing the red hot resistive heat-generating wire 3 in operation to vibrate easily, becoming liable to disconnect and insufficient thermal insulation capacity. Nevertheless, the cause of arc discharges and chaining disconnection accidents resulting from dielectric breakdown has been taken in the past as resulting from faulty operations of the operator and has not been fully analyzed.

And the shape of the fin 9 as shown in FIG. 15 is designed to facilitate the radiation of heat. Due to its pointed tip, however, at high voltage, corona discharges begins to occur at the sharp edge 9*a*, 9*a* and finally arc discharges occur between rectangular frame boxes 12' or mutually between fins 9 of resistor elements 1' of three-phase resistor circuits 17 arranged in parallel, causing dielectric breakdown. Many years of experiment have finally led to the discovery of this fact. And it has been impossible to use the conventional resistor elements 1' to carry out load characteristic tests without running any risk.

As a safety measure against possible dielectric breakdown of a rectangular frame box 12' due to arc discharges, insulators 22 are provided. However, as the high-voltage overcurrent is cut off from any means of escape, the whole high-voltage resistor apparatus γa' runs the risk of a burnout breakdown, and the workers cannot approach the same during the operation of the apparatus due to a high risk.

In addition, due to the blocking of staggered fins 9, it is difficult to obtain a perspective view from the above of the inside of the rectangular frame box 12' and this impeded maintenance, inspection and servicing work. Moreover, as the presence of the fins 9 impeded the work of pulling out only burned out or disconnected resistor elements 1' from the rectangular frame box 12', any partial replacement of resistor elements 1' is impossible at the site of the operation. Therefore, rectangular frame boxes 12' must be brought back to the factory every time, disassembled and removed other resistor elements 1' and the problem parts had to be replaced. For this reason, load characteristics tests had to be interrupted and delayed.

This arc discharge dissuades us from carrying out any test operations (Japanese Patent Laid-open No. 2000-19231, p (3) 0013-14). Any major failure of the high-voltage resistor apparatus γa' due to arc discharges leads to melting and welding in a horrible shape of a plurality of resistor elements 1', electric wires (input lines 16, connecting lines 18, 20), the first and second terminal plates 15, 19 and the rectangular frame box 12' and to the burnout breakdown of insulators 22.

Even if anyone tries to observe the initial phenomenon of a failure, approximately one hundred and fifty resistor elements 1' are housed in a rectangular frame box 12' to be used at a high voltage the sides of which are covered. Thus, it is impossible to peek at the inside, and any attempt to observe anything deep inside by means of a fiberscope is foiled by a high voltage. By looking at the remnant of a burnt high-voltage resistor apparatus γa', it was extremely difficult to determine the cause, whether it was due to insufficient cooling or whether arc discharge occurred in a very short period of time after the initial failure.

Here, we will explain on the possible impact of the disconnection of a single resistor element 1' on chaining disconnection, when three-phase connecting lines 20 are used to connect in common the neutral point N on the second terminal plate 19 in order to realize Y-connections of resistor arrays 10' by the group of three stages in a high-voltage resistor apparatus γa'. This chaining disconnection generates unbalanced potentials at the neutral point N and reduces the capacity of the high-voltage resistor apparatus γa'.

Here, the three-phase resistor circuit 17 of three phase 6,600V and 750 kW is constituted by a total of four hundreds and fifty resistor elements 1' of 1.67 kW each, each three-phase constituted by connecting in parallel fifteen stages of resistor array 10' constituted by connecting in series ten resistor elements 1' in one phase, and each three phases being Y-connected. When this is shown by equivalent circuits of the three-phase resistor circuit 17 of FIG. 21, the result will be an equivalent potential disposition of the R phase shown in FIG. 22 and the Y series equivalent circuits of the lower-capacity high-voltage resistor circuit βa' shown in FIG. 23.

By assuming various fault phases between the array phases R-N as shown in FIG. 24, we will examine changes in the sound array phases S-N and T-N. Even in a balanced state between the three-phase voltage on the source and the three-phase parallel resistance value of the load, due to intermittent heating as in the case of speed governor test or heating for long hours as in the case of rated load operation, the resistor elements 1' whose resistance value is high or whose combination with cooling condition is inappropriate are first to deteriorate and to break.

The entire resistor array 10' of which a single resistor element 1' has been broken ceases to function (broken wire array phase). The parallel resistance value of the R array phase including a broken wire array phase is greater than sound S and T array phases. Accordingly, the voltage between R-N is higher than S-N and T-N according to a given principle. The equivalent circuits are shown respectively for R array phase one line broken in FIG. 24, for the potential rise by line broken in FIG. 25(a) and for the different potential disposition in FIG. 26.

$6600/\sqrt{3}=3810V$ will be $6600\sqrt{3}/2=5715V$.

This rise in voltage increases the heat generated by the group of resistor elements 1' of the sound array phases Nos. 2-15 (sound array phases #2-#15) remaining in R array phase and induces the wire rupture of the second adjoining resistor element 1' arranged in parallel. And increases in voltage of the third, fourth and other groups of resistor elements 1' accelerates the rupture of wire (chain breaking), and the voltage between R-N at the time when remaining array phases Nos. 2-15 of the R array phase cease function rises to 5,715 V. This chaining disconnection occurs earlier as the capacity of the lower-capacity high-voltage resistor circuit βa is smaller, and turns the R array phase a fault lower-capacity high-voltage resistor circuit (βa') (see FIG. 25(a)).

A three-phase 216 kW lower-capacity high-voltage resistor circuit βa with R fault phase turns into a single-phase 375 kW between S-T. It generates an unbalanced load and a general decline of capacity (capacity shortage) of the high-voltage resistor apparatus γa'. On the other hand, it becomes difficult to secure a number of combinations of three-phase resistor circuits 17 corresponding to the target value.

And as FIG. 25(b) shows, potential rises in case of a short-circuit between R-N, and the voltage between R-N during a short-circuit falls close to zero. As a result, the voltage of sound array phases S-N and T-N rises close to 6,600 V. This rise in voltage induces chain breaking in resistor elements 1' of the sound array phases S-N and T-N. Resistor elements 1' with a withstand voltage of 2,000 VAC for 1 minute cannot be guaranteed against any dielectric breakdown after the passage of one minute.

As each high-voltage resistor apparatus γa' is insulated by insulators, neither ground relay nor overcurrent relay works even if arc discharges occur between resistor elements 1' and connection terminal 7 or rectangular frame boxes 12', and the resulting damages expand.

When the neutral point N of other three-phase resistor circuits 17 are connected in common with the second terminal plate 19 as the connecting lines 20 shown in FIG. 17, any increase in the potential of the three-phase resistor circuit 17 with a fault phase spreads to other sound three-phase resistor circuits 17 connected in parallel thereto. A three-phase resistor circuit 17 having a dormant resistor array 10' and other sound three-phase resistor circuits 17 connected in parallel thereto acquire different potential disposition, and here again the fins 9 form an environment for discharges.

The shape of each fin 9 is nearly circular as seen from the axial direction. When viewed from its side, however, the circumferential edge of a thin plate constitutes a sharp edge 9a (see FIG. 15). At high voltage, the sharper the edge, the more liable to discharge, and the sharp edges 9a of fins 9 constitute areas susceptible of inducing discharges. In a lower-capacity high-voltage resistor circuit βa, they play a role of reducing the voltage for starting discharges, and discharges occur when the following different potential disposition is in place.

A high-voltage resistor apparatus γa having one array phase for each stage of a rectangular frame box 12' connects the R array phase of the high-voltage power generator G with the first terminal plate 15 and uses the second terminal plate 19 as the neutral point (node). Vertically stages Nos. 1-15 (#1-#15) of the resistor array 10' are connected in parallel, each resistor array 10' being constituted by a row of resistor elements 1' connected in series and numbered 1-10 (#1-#10) from the left to the right for each stage. The potential difference between resistor elements 1' connected in series is a difference of 381 V when they are sound, and the potential difference between the resistor elements 1' connected in parallel is zero. They constitute an equivalent potential disposition and are stable (see FIG. 22).

Supposing that a resistor element 1' of the resistor array 10' (for example, #10 on the stage No. 1) is broken, and the R side is maintained at 3,810 V and the neutral point N is kept at zero V. A comparison of the distribution of potential in this state reveals that the voltage of 3,810V on the R side extends to all the #1-#9 on the first stage. Between #9 on the first stage and the adjoining resistor element 1', a difference of potential of close to 3,174V develops constituting a different potential disposition (see FIG. 26). It should be noted in this connection that the breakdown of the resistor element 1' does not necessarily occur between the order Nos. 5-6.

Although it is difficult to find out the starting point of discharge from the trace of meltdown due to arc discharges, it is possible to observe corona discharge by raising gradually voltage in a dark room by taking note of the fact that initial discharges begin with a corona. Initial corona discharges do not induce meltdown, and the discharge point can be easily identified. On the resistor element 1' side, the cut end of the sharp edge 9a of fins 9 or burrs or dusts that have attached thereon serve as the starting point for discharges. The other side tends to fall preferably on far-away protrusions than flat plates nearby.

A fin 9 having a sharp edge starts discharges between fins 9 in case of the breakdown of a resistor element 1'. As a chain reaction to this, discharges occur between the connection terminal 7 on both ends of a resistor element 1' and metal outer tube 2'. It is impossible to prevent discharges from fins 9 due to different potential disposition even if insulating materials are used on the rectangular frame boxes 12'.

In a conventional high-voltage resistor apparatus γa, it was impossible to clarify the chain breaking that occur when weak insulation and the neutral point N of three-phase resistor circuits 17 constituted by the Y-connection of resistor array 10' are connected in common and the ill effect of discharge characteristic of fins 9 extends successively when one of the resistor elements 1' is broken. Accidents resulting from these ill effects tended to be considered simply as the results of faulty operations.

And in case where Δ-connection without common neutral point N is adopted in a high-voltage resistor apparatus γa', no chaining disconnection due to common neutral point N occurs. However, it is impossible to prevent chain breaking due to arc discharges between parallel resistor elements 1' and arc discharges between a resistor element 1' and an arrangement board 12a'.

In addition, due to the employment of resistor elements 1' each having fin 9, one lower-capacity configuration bank 13' has to be bridge held by one rectangular frame box, and therefore a large number of sub-divided lower-capacity configuration banks 13' are necessarily required as compared with the dry-type high-voltage load system apparatus δ'. In addition, an air blower 24' must be fitted on each lower-capacity configuration bank 13' increasing the initial cost (production cost) and running cost. On top of this, housing facilities and autotrucks 27 for housing and mounting the dry-type high-voltage load system apparatus δ' become large, the former requiring a large area for installing and the latter being restricted by the width of traffic roads leading to and parking space at the site.

The major objects of the present invention are as follows:

A first object of the present invention is to provide a dry-type high-voltage load system apparatus constructed to be strong against chain breaking and arc discharges and a method of preventing chain breaking and arc discharges on the same apparatus.

A second object of the present invention is to provide a dry-type high-voltage load system by adopting a compact resistor element of a special construction for its high-voltage resistor circuit element and a method of preventing chain breaking and arc discharges on the same apparatus.

A third object of the present invention is to provide a dry-type high-voltage load system apparatus having a high-voltage load system circuit resistant against vibrations, arc discharges and chain breaking and a method of preventing chain breaking and arc discharges on the same apparatus.

A fourth object of the present invention is to provide a dry-type high-voltage load system apparatus wherein a compact high-voltage load system circuit can be formed and a method of preventing chain breaking and arc discharges on the same apparatus.

A fifth object of the present invention is to provide a dry-type high-voltage load system apparatus wherein a high-voltage bank and a low-voltage bank can be bridge held respectively in two vertical rectangular frame boxes or both of them in a horizontal rectangular frame box and a method of preventing chain breaking and arc discharges on the same apparatus.

A sixth object of the present invention is to provide a dry-type high-voltage load system apparatus wherein the housing facilities for housing and mounting the high-voltage load apparatus and the autotrucks for loading and housing the same can be made smaller and a method of preventing chain breaking and arc discharges on the same apparatus.

Other objects of the present invention will be automatically obvious from the descriptions of the specification, drawings and especially claims hereof.

DISCLOSURE OF INVENTION

In order to solve the foregoing issues, the apparatus of the present invention is a dry-type high-voltage load system apparatus having a high-voltage load system circuit connected in parallel with a high-voltage generating system connected through the central breaker with a low-voltage bank constituted by a plurality of lower-capacity low-voltage resistor circuit banks each consisting of a plurality of low-voltage three-phase resistor circuits respectively connected in parallel with each of a plurality of switches branching from the output terminal of a transformer, and a high-voltage bank constituted by a plurality of lower-capacity high-voltage resistor circuit banks each consisting of a plurality of high-voltage three-phase resistor circuits respectively connected in parallel with each of a plurality of parallel switches, wherein resistor array phases each constituted by a plurality of resistor elements connected in series are not delta or mutually connected and are respectively connected independently with a neutral node for Y-connection to form the three-phase resistor circuit mentioned above, the resistor element having a high withstand voltage insulating sleeve fit inserted extractably on points close to the both ends of a metal cylindrical external sheath supported by various supports and without any fin for radiating heat extending spirally in the longitudinal direction on the periphery related to arc discharges.

In order to solve the issues described above, the method of the present invention prevents chain breaking and arc discharges on a dry-type high-voltage load system apparatus having a high-voltage load system circuit connected in parallel with a high-voltage generating system connected through the central breaker with a low-voltage bank constituted by a plurality of lower-capacity low-voltage resistor circuit banks each consisting of a plurality of low-voltage three-phase resistor circuits respectively connected in parallel with each of a plurality of parallel switches branching out from the output terminal of a transformer, and a high-voltage bank constituted by a plurality of lower-capacity high-voltage resistor circuit banks each consisting of a plurality of high-voltage three-phase resistor circuits respectively connected in parallel with each of a plurality of parallel switches, wherein chain breaking and arc discharges are prevented by adopting resistor array phases each constituted by a plurality of resistor elements connected in series not Δ-connected nor mutually connected and respectively connected independently with a neutral node for Y-connection to form the three-phase resistor circuit mentioned above, the resistor element having a high withstand voltage insulating sleeve fit inserted extractably on points close to the both ends of a metal cylindrical sheath supported by various supports and without any fin for radiating heat extending spirally in the longitudinal direction on the periphery related to arc discharges.

Specifically speaking in more detail, for the solution of the issues mentioned above, the following respective new characteristic structural means or methods listed in the present invention are adopted to achieve the objects mentioned above.

Specifically, a first feature of the apparatus of the present invention is to employ a dry-type high-voltage load system apparatus having a high-voltage load system circuit comprising: a low-voltage bank composed of a plurality of lower-capacity configuration banks for a low-voltage resistor circuit each composed of a plurality of low-voltage three-phase resistor circuits connected in parallel to each of a plurality of switches connected in parallel to an output terminal of a transformer; and a high-voltage bank composed of a plurality of lower-capacity configuration banks for a high-voltage resistor circuit each composed of a plurality of high-voltage three-phase resistor circuits connected in parallel to each of a plurality of switches, the low-voltage bank and the high-voltage bank being connected in parallel to a high-voltage power generator through a central breaker, characterized by comprising: the low-voltage three-phase resistor circuit and the high-voltage three-phase resistor circuit each being composed of resistor arrays in three phases, each of the resistor arrays being composed of resistor elements connected in series, in a form of a Y-connection in which three resistor arrays are concentrated for reconciliation of their phase so that an isolated and independent neutral point unconnected commonly to those of the other three-phase resistor circuits is formed, or in a form of a Δ-connection in which each of terminals of the resistor arrays in three phases is connected to each of in-phase branch distribution lines of a power cable, each of the resistor elements comprising: a cylindrical outer tube made of metal; a resistive heat-generating wire wound spirally and extending between inner ends of electrode rods inserted respectively from both ends of the outer tube; an insulating material filling up a space between the resistive heat-generating wire with the electrode rods and an internal surface of the outer tube and fired; and high-voltage proof insulating sleeves extractably encasing and anchored in portions adjacent to the both ends of the outer tube to be supported by various supporters.

A second feature of the apparatus of the present invention is to employ the structure of a dry-type high-voltage load system apparatus, wherein a length and a thickness of the high-voltage proof insulating sleeve in the above-mentioned first feature of the apparatus of the present invention are adjustably formed in accordance with an operating voltage.

A third feature of the apparatus of the present invention is to employ a dry-type high-voltage load system apparatus, wherein the high-voltage proof insulating sleeve in the above-mentioned second feature of the apparatus of the present invention is made of sintered ceramic having an insulation capacity of close to approximately 36 kV for 1 minute when a material with a withstand voltage of 12 kVAC/mm for 1 minute and 3 mm thick is employed.

A fourth feature of the apparatus of the present invention is to employ a dry-type high-voltage load system apparatus wherein the high-voltage proof insulating sleeve in the above-mentioned second or third feature of the apparatus of the present invention is around and approximately 3 mm thick and around and approximately 100 mm long.

A fifth feature of the apparatus of the present invention is to employ a dry-type high-voltage load system apparatus, wherein the resistor arrays in the above-mentioned first, second or third feature of the apparatus of the present invention are connected in the form of the Y- or Δ-connection to form the high-voltage three-phase resistor circuit in each of the lower-capacity configuration banks of the high-voltage bank.

A sixth feature of the apparatus of the present invention is to employ a dry-type high-voltage load system apparatus, wherein the resistor arrays in the above-mentioned first, second or third feature of the apparatus of the present invention are connected in the form of the Δ-connection to form the low-voltage three-phase resistor circuits and in the form of the Y-connection to form the high-voltage three-phase resistor circuit.

A seventh feature of the apparatus of the present invention is to employ a dry-type high-voltage load system apparatus, wherein the low-voltage bank and the high-voltage bank in the above-mentioned first, second or third feature of the apparatus of the present invention are housed, for all of the lower-capacity configuration banks, in exclusive zones distributed in each of two vertical rectangular frame boxes each having an air blower, wherein vertical multicolumn arrays of the resistor elements in each of the lower-capacity configuration banks are penetratingly bridged in the exclusive zones by both ends thereof.

An eighth feature of the apparatus of the present invention is to employ a dry-type high-voltage load system apparatus, wherein the low-voltage bank and the high-voltage bank in the above-mentioned first, second or third feature of the apparatus of the present invention are housed, for each of the lower-capacity configuration banks, in exclusive zones distributed in a horizontal rectangular frame box having an air blower, wherein lateral multistage arrays of the resistor elements in each of the lower-capacity configuration banks are penetratingly bridged in the exclusive zones by both ends thereof.

A ninth feature of the apparatus of the present invention is to employ a dry-type high-voltage load system apparatus, wherein the vertical rectangular frame box in the above-mentioned seventh feature of the apparatus of the present invention is directly grounded to form a chassis ground.

A tenth feature of the apparatus of the present invention is to employ a dry-type high-voltage load system apparatus, wherein the horizontal rectangular frame in the above-mentioned eighth feature of the apparatus of the present invention is directly grounded to form a chassis ground.

An eleventh feature of the apparatus of the present invention is to employ a dry-type high-voltage load system apparatus, wherein the resistor element for the high-voltage three-phase resistor circuit as Y-connected in the above-mentioned first, second or third feature of the apparatus of the present invention has a capacity of around and approximately 381 V/1.67 kW.

A twelfth feature of the apparatus of the present invention is to employ a dry-type high-voltage load system apparatus, wherein the resistor element for the high-voltage three-phase resistor circuit as Δ-connected in the above-mentioned first, second or third feature of the apparatus of the present invention has a capacity of around and approximately 412.5 V/1.74 kW.

A thirteenth feature of the apparatus of the present invention is to employ a dry-type high-voltage load system apparatus, wherein the resistor array for the high-voltage three-phase resistor circuit as Y-connected in the above-mentioned first, second or third feature of the apparatus of the present invention is composed of approximately ten resistor elements connected in series for an operating voltage of 6,600 V.

A fourteenth feature of the apparatus of the present invention is to employ a dry-type high-voltage load system apparatus, wherein the resistor array for the high-voltage three-phase resistor circuit as Δ-connected in the above-mentioned first, second or third feature of the apparatus of the present invention is composed of approximately sixteen resistor elements connected in series for an operating voltage of 6,600 V.

A fifteenth feature of the apparatus of the present invention is to employ a dry-type high-voltage load system apparatus, wherein the high-voltage three-phase resistor circuit as Y-connected in the above-mentioned eleventh feature of the apparatus of the present invention has a capacity of around and approximately 50.1 kW.

A sixteenth feature of the apparatus of the present invention is to employ a dry-type high-voltage load system apparatus, wherein the high-voltage three-phase resistor circuit as Y-connected in the above-mentioned thirteenth feature of the apparatus of the present invention has a capacity of around and approximately 50.1 kW.

A seventeenth feature of the apparatus of the present invention is to employ a dry-type high-voltage load system apparatus, wherein the high-voltage three-phase resistor circuit as Δ-connected in the above-mentioned twelfth feature of the apparatus of the present invention has a capacity of around and approximately 83.52 kW.

An eighteenth feature of the apparatus of the present invention is to employ a dry-type high-voltage load system apparatus, wherein the high-voltage three-phase resistor circuit as Δ-connected in the above-mentioned fourteenth feature of the apparatus of the present invention has a capacity of around and approximately 83.52 kW.

A nineteenth feature of the apparatus of the present invention is to employ a dry-type high-voltage load system apparatus, wherein the high-voltage bank in the above-mentioned first, second or third feature of the apparatus of the present invention is composed in parallel of one lower-capacity configuration bank of around and approximately 250 kW and three lower-capacity configuration banks of around and approximately 500 kW, the one lower-capacity configuration bank and the three lower-capacity configuration banks being composed in parallel of five and ten high-voltage three-phase resistor circuits as Y-connected, respectively.

A twentieth feature of the apparatus of the present invention is to employ a dry-type high-voltage load system apparatus, wherein the high-voltage bank in the above-mentioned first, second or third feature of the apparatus of the present invention is composed in parallel of one lower-capacity configuration bank of around and approximately 250 kW and three lower-capacity configuration banks of around and approximately 500 kW, the one lower-capacity configuration bank and the three lower-capacity configuration banks being composed in parallel of three and six high-voltage three-phase resistor circuits as Δ-connected, respectively.

A twenty-first feature of the apparatus of the present invention is to employ a dry-type high-voltage load system apparatus, wherein the low-voltage bank in the above-mentioned first, second or third feature of the apparatus of the present invention is composed in parallel of two lower-capacity configuration banks of around and approximately 62.5 kW and one lower-capacity configuration bank of around and approximately 125 kW, the two lower-capacity configuration banks and the one lower-capacity configuration bank being composed in parallel of a plurality of the low-voltage three-phase resistor circuits as Y- and Δ-connected, respectively.

A twenty-second feature of the apparatus of the present invention is to employ a dry-type high-voltage load system apparatus wherein the supporters in the above-mentioned first, second or third feature of the apparatus of the present invention are arrangement boards on both sides of a rectangular frame box of a chassis-ground-type, of which a cooling air intake opening and a heated air exhaust opening are respectively provided at a bottom and a top thereof.

A twenty-third feature of the apparatus of the present invention is to employ a dry-type high-voltage load system apparatus wherein the arrangement boards in the above-mentioned twenty-second feature of the apparatus of the present invention have circular holding holes each having a dimension allowing the high-voltage proof insulating sleeve to extractably penetrate vertically or horizontally in mutually alternate multiple stages or multiple columns by shifting by half an arranging position in each horizontal stage in case that a vertical rectangular frame box is employed and in each vertical column in case that a horizontal rectangular frame box is employed.

A twenty-fourth feature of the apparatus of the present invention is to employ a dry-type high-voltage load system apparatus wherein the resistor element in the above-mentioned twenty-third feature of the apparatus of the present invention is penetratingly bridged through the holding holes opened on both sides of the arrangement boards of the vertical or horizontal rectangular frame box with supports of the high-voltage proof insulating sleeves anchored to the holding holes by means of spring grooved retaining rings, and is capable of being extracted from the holding holes together with the high-voltage proof insulating sleeves.

A twenty-fifth feature of the apparatus of the present invention is to employ a dry-type high-voltage load system apparatus wherein the high-voltage load system circuit in the above-mentioned first, second or third feature of the apparatus of the present invention is composed by connecting mutually in parallel a voltmeter to the power cable on a side of the high-voltage power generator and an ammeter through an overcurrent relay to the power cable on a bank side by intermediately positioning the central breaker, connecting a wattmeter to a position between the voltmeter and the ammeter, and connecting a ground relay to the power cable bridging the power generator and the voltmeter.

A twenty-sixth feature of the apparatus of the present invention is to employ a dry-type high-voltage load system apparatus wherein the two vertical rectangular frame boxes in the above-mentioned seventh feature of the apparatus of the present invention are installed in a load room of an installing-type housing, the load room having heated air exhaust windows and cooling air intake windows of open/close-types respectively at a top wall side and both lateral wall sides thereof respectively corresponding to the heated air exhaust openings and the air blowers of the vertical rectangular frame boxes, and are adjoining through a partition wall to an instrument panel room prepared at one-side of the install-type housing, the instrument panel room having a door, in which the transformer and the switches are provided at an external wall side of the instrument panel room, the external wall side having a control panel and an instrument panel.

A twenty-seventh feature of the apparatus of the present invention is to employ a dry-type high-voltage load system apparatus wherein the one horizontal rectangular frame box in the above-mentioned eighth feature of the apparatus of the present invention is installed in a load room of an installing-type housing, the road room having a heated air exhaust window of a shutter-type and a cooling air intake window respectively at an end wall side and both lateral wall sides thereof respectively corresponding to the heated air exhaust opening and the air blower of the horizontal rectangular frame box, and is adjoining through a partition wall to an instrument panel room prepared at on-side of the install-type housing, the instrument panel room having upper and lower compartments, in which a control panel and an instrument panel, and the transformer and the switches are respectively provided at the upper and lower compartments.

A twenty-eighth feature of the apparatus of the present invention is to employ a dry-type high-voltage load system apparatus wherein the two vertical rectangular frame boxes in the above-mentioned seventh feature of the apparatus of the present invention are installed in a load room of an all-weather hermetic container loaded onto a loading platform of an autotruck, the load room having heated air exhaust windows and cooling air intake windows of open/close-types respectively at a top wall side and both lateral wall sides thereof respectively corresponding to the heated air exhaust openings and the air blowers of the vertical rectangular frame boxes, and are adjoining through a partition wall to a control room and an appliance room arranged orderly from a front side of the autotruck, each of the control and appliance rooms having doors, in which a control panel and an instrument panel, and the transformer and the switches are respectively provided at the control and appliance rooms.

A twenty-ninth feature of the apparatus of the present invention is to employ a dry-type high-voltage load system apparatus wherein the one horizontal rectangular frame box in the above-mentioned eighth feature of the apparatus of the present invention is installed in a load room of an all-weather hermetic container of a small-type loaded onto a loading platform of an autotruck of a small-type, the load room having heated air exhaust windows of a shutter-type and cooling air intake windows of an open/close-type respectively at a whole rear wall side and both lateral wall sides thereof respectively corresponding to the heated air exhaust opening and the air blower of the horizontal rectangular frame boxes, and are adjoining through a partition wall to a control room, the control room having a door, in which a control panel, an instrument panel, the transformer and the switches are provided at the control room.

A first feature of the method of the present invention is to employ a method of preventing chain breaking and arc discharge of a dry-type high-voltage load system apparatus having a high-voltage load system circuit comprising: a low-voltage bank composed of a plurality of lower-capacity configuration banks for a low-voltage resistor circuit each composed of a plurality of low-voltage three-phase resistor circuits connected in parallel to each of a plurality of switches connected in parallel to an output terminal of a transformer; and a high-voltage bank composed of a plurality of lower-capacity configuration banks for a high-voltage resistor circuit each composed of a plurality of high-voltage three-phase resistor circuits connected in parallel to each of a plurality of switches, the low-voltage bank and the high-voltage bank being connected in parallel to a high-voltage power generator through a central breaker, characterized by comprising steps of: composing the low-voltage three-phase resistor circuit and the high-voltage three-phase resistor circuit by means of resistor arrays in three phases, each of the resistor arrays being composed of resistor elements connected in series, in a form of a Y-connection in which three resistor arrays are concentrated for reconciliation of their phase so that an isolated and independent neutral point unconnected commonly to those of the other three-phase resistor circuits is formed, or in a form of a Δ-connection in which each of terminals of the resistor arrays in three phases is connected to each of in-phase branch distribution lines of a power cable, each of the resistor elements comprising: a cylindrical outer tube made of metal; a resistive heat-generating wire wound spirally and extending between inner ends of electrode rods inserted respectively from both ends of the outer tube; an insulating material filling up a space between the resistive heat-generating wire with the electrode rods and an internal surface of the outer tube and fired; and high-voltage proof insulating sleeves extractably encasing and anchored in portions adjacent to the both ends of the outer tube to be supported by various supporters; and preventing the arc discharge which may occur between the resistor elements and the supporters or mutually between the resistor elements arranged in parallel as well as the chain breaking which may occur through the terminals.

A second feature of the method of the present invention is to employ a method of preventing chain breaking and arc discharge of a dry-type high-voltage load system apparatus, wherein a length and a thickness of the high-voltage proof insulating sleeve in the above-mentioned first feature of the method of the present invention are adjustably formed in accordance with an operating voltage.

A third feature of the method of the present invention is to employ a method of preventing chain breaking and arc discharge of a dry-type high-voltage load system apparatus, wherein the high-voltage proof insulating sleeve in the above-mentioned second feature of the method of the present invention is made of sintered ceramic having an insulation capacity of close to approximately 36 kV for 1 minute when a material with a withstand voltage of 12 kVAC/mm for 1 minute and 3 mm thick is employed.

A fourth feature of the method of the present invention is to employ a method of preventing chain breaking and arc discharge of a dry-type high-voltage load system apparatus, wherein the high-voltage proof insulating sleeve in the above-mentioned second or third feature of the method of the present invention is around and approximately 3 mm thick and around and approximately 100 mm long.

A fifth feature of the method of the present invention is to employ a method of preventing chain breaking and arc discharge of a dry-type high-voltage load system apparatus, wherein the supporters in the above-mentioned first, second or third feature of the method of the present invention are arrangement boards on both sides of a rectangular frame box, and both ends of the resistor elements are penetratingly bridged between the rectangular frame alternately at equal intervals in vertical multiple columns or horizontal multiple stages so that the adjoining columns or stages may be staggered.

A sixth feature of the method of the present invention is to employ a method of preventing chain breaking and arc discharge of a dry-type high-voltage load system apparatus, wherein the resistor element for the high-voltage three-phase resistor circuit as Y-connected in the above-mentioned first, second or third feature of the method of the present invention has a capacity of around and approximately 381 V/1.67 kW.

A seventh feature of the method of the present invention is to employ a method of preventing chain breaking and arc discharge of a dry-type high-voltage load system apparatus, wherein the resistor element for the high-voltage three-phase resistor circuit as Δ-connected in the above-mentioned first, second or third feature of the method of the present invention has a capacity of around and approximately 412.5 V/1.74 kW.

An eighth feature of the method of the present invention is to employ a method of preventing chain breaking and arc discharge of a dry-type high-voltage load system apparatus, wherein the resistor array for the high-voltage three-phase resistor circuit as Y-connected in the above-mentioned first, second or third feature of the method of the present invention is composed of approximately ten resistor elements connected in series for an operating voltage of 6,600 V.

A ninth feature of the method of the present invention is to employ a method of preventing chain breaking and arc discharge of a dry-type high-voltage load system apparatus, wherein the resistor array for the high-voltage three-phase resistor circuit as Δ-connected in the above-mentioned first, second or third feature of the method of the present invention is composed of approximately sixteen resistor elements connected in series for an operating voltage of 6,600 V.

A tenth feature of the method of the present invention is to employ a method of preventing chain breaking and arc discharge of a dry-type high-voltage load system apparatus, wherein the high-voltage three-phase resistor circuit as Y-connected in the above-mentioned sixth feature of the method of the present invention has a capacity of around and approximately 50.1 kW.

An eleventh feature of the method of the present invention is to employ a method of preventing chain breaking and arc discharge of a dry-type high-voltage load system apparatus, wherein the high-voltage three-phase resistor circuit as Y-connected in the above-mentioned eighth feature of the method of the present invention has a capacity of around and approximately 50.1 kW.

A twelfth feature of the method of the present invention is to employ a method of preventing chain breaking and arc discharge of a dry-type high-voltage load system apparatus, wherein the high-voltage three-phase resistor circuit as Δ-connected in the above-mentioned seventh feature of the method of the present invention has a capacity of around and approximately 83.52 kW.

A thirteenth feature of the method of the present invention is to employ a method of preventing chain breaking and arc discharge of a dry-type high-voltage load system apparatus, wherein the high-voltage three-phase resistor circuit as Δ-connected in the above-mentioned ninth feature of the method of the present invention has a capacity of around and approximately 83.52 kW.

Due to the employment of the structures described above, the present invention prevents spontaneously this type of chain breaking because the dry-type high-voltage load system apparatus is not electrically adversely affected by the mutual interventions from the independent neutral points of other parallel three-phase resistor circuits through the isolated and separate form of various independent neutral points having acquired unbalanced potential due to a broken resistor element of a three-phase resistor circuit Y-connected.

And due to the employment of a resistor element having an outstanding arc discharge resistance and insulation resistance, the causes of chain breaking due to arc discharges mutually between resistor elements of parallel resistor array phases within a same three-phase resistor circuit and arc discharges mutually between resistor elements of parallel three-phase resistor circuits are eliminated and stable reliability and highly faithful operation can be secured.

In addition, broken resistor elements can be drawn out one by one by removing spring grooved retaining ring from the arrangement boards of the high-voltage resistor apparatus, and can be replaced by new resistor elements. This replacement and repair works can be easily carried out at site, and it is possible to address to all failures of resistor elements of the high-voltage resistor circuit.

Tests conducted by using resistor elements without such fins used in the present invention reveal that due to the cylindrical form of high withstand voltage insulating sleeves, a good draft can be maintained by means of a cooling fan, and no turbulence occurs within the rectangular frame box. Thus, good and sufficient heat radiation effect can be obtained in comparison with the prior art examples.

The cylindrical form of this resistor element does not constitute an obstacle to the circulation of air and allows air to circulate smoothly to the uppermost part or the back of the vertical or horizontal rectangular frame box of the high-voltage resistor apparatus. In addition, due to the absence of spiral fins, a good perspective within the rectangular frame box can be obtained from the above or from behind. And the possibility of easily drawing various resistor elements out of the rectangular frame box by removing the spring grooved retaining rings is very convenient for the maintenance, inspection and repair works at the site.

And this promotes the miniaturization of the rectangular frame box, suppresses the occurrence of vibrations, eliminates the necessity of setting rubber cushions and reduces drastically the risks involved with the tests of chassis-ground type equipment. In addition, due to the absence of protruding tip peak edge like the fins of the prior art example, dielectric strength increases, the risk of dielectric breakdown can be avoided, and further dielectric breakdowns can be prevented by fixing the resistor elements on their supports through high withstand voltage insulating sleeve provided thereon.

The prevention of chain breaking of and arc discharges from resistor elements by the present invention enhances the reliability of the apparatuses itself but the mitigation of physical and mental workload on operators is the most important effect.

The possibility of housing three phases of high and low voltage and a plurality of lower-capacity configuration banks in one or two rectangular frame box(es) having metal arrangement boards has the following additional effects.

(1) As initial failures start with short circuits (light failures), the metal arrangement boards can be easily grounded, and it is possible to prevent such light failure from expanding into serious failures by detecting and solving failures at an early stage by ensuring that the ground relay work effectively.

(2) The staggered disposition of finless resistor elements between the adjoining upper and lower stages improves their cooling effect at low voltage, while larger spaces made available for their disposition in high voltage circuit enhances the effect of preventing arc discharges.

(3) The number of rectangular frame boxes and air blowers can be reduced to approximately one third (⅓), reducing the whole apparatus smaller and more compact. In addition, broken resistor elements can be easily replaced.

To the extent that the vehicle mount-type high-voltage load system apparatus is made smaller and more compact, and insulators for insulating the rectangular frame box and rubber cushions are no longer necessary, the center of gravity of the rectangular frame box can be lowered, and the falling down angle of vehicles can be expanded to realize a large falling down angle. Vehicles having a large falling down angle can control their rotation while running at a high speed and control their falling down on poor roads, and they can reduce their height, they are less subject to rolling due to side wind. Dry-type high-voltage load system apparatuses are sometimes transported over a one-way distance of 1,000 km or more, and the improvement of their transportability has the effect of mitigating the physical and mental burden of drivers.

BEST MODE FOR CARRYING OUT THE INVENTION

Typical examples of the apparatuses and methods representing the embodiments of the present invention will be described below with reference to drawings. Prior to the description of the embodiments of the present invention, however, examples of the resistor elements used in the examples of apparatus will be described.

{Examples of Resistor Elements}

Figure 1:
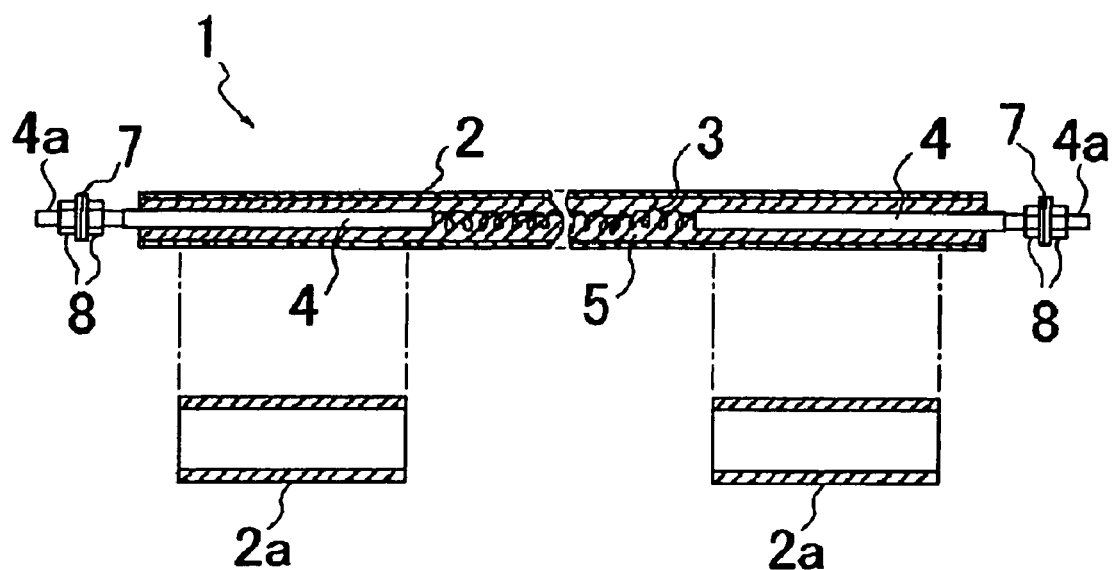
FIG. 1 is a fragmentary vertical cutaway side view of a resistor element used in the present invention from which a high withstand voltage insulating sleeve is disassembled and removed.
Figure 2:
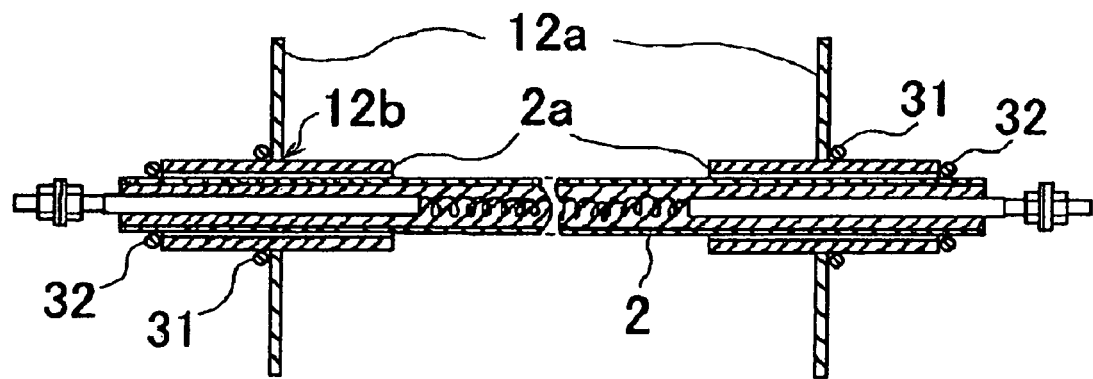
FIG. 2 is a fragmentary vertical cutaway side view illustrating the fixture of a resistor element the both ends of which penetratingly bridge the arrangement boards mentioned above.

FIG. 1 is a fragmentary vertical cutaway side view illustrating a resistor element from which a high withstand voltage insulating sleeve is disassembled and removed, and FIG. 2 is a fragmentary vertical cutaway side view illustrating the fixture of a resistor element the both ends of which penetratingly bridge the arrangement boards.

Incidentally, in this example of resistor element, identical parts are marked by identical numerals and identical numerals without any prime (') represent corresponding parts of the prior art example. The same rule applies to examples of apparatuses and methods.

In the figure, numeral 1 denotes a resistor elements, and 2 an outer tube made of metal in a cylindrical shape as an overall protective material for the insulating material 5 satisfying the requirements of a form that makes the occurrence of discharges difficult by smoothing the surface and of an excellent heat radiation characteristic without the aid of spiral fins. Numeral 3 denotes a resistive heat-generating wire in a coiled shape connecting in a tensional state the internal ends of electrode rods 4, 4 respectively inserted from the both ends of the outer tube 2.

And numeral 5 denotes an insulating material similar to 5' of the prior art example. It is made by heating, baking and solidifying a powdery material and is introduced into the space between the inside wall of the outer tube 2, the conductive metal electrode rods 4, 4 and the resistive heat-generating wire 3. Due to this, the insulating material 5 plays the role of evenly insulating the outer tube 2 form the electrode rods 4, 4 and the resistive heat-generating wire 3, and at the same time absorbs vibratory energy from the outside and securely fix the resistive heat-generating wire 3 having a weak self-sustaining power.

Because of its solidified form unlike any prior products, even outside vibration does not cause the insulating material 5 to be lopsided, and dependable insulation can be expected. Numeral 7 denotes a connection terminal inserted into the outer end threaded portion 4*a* of the outer ends of the electrode rods 4, 4 and pinch fixed on both sides by nuts 8, 8.

Numeral 2*a* denotes a high-voltage proof insulating sleeve. The high-voltage proof insulating sleeve 2*a* is made of a sintered ceramic having an excellent electric withstand voltage characteristic, heat resistance, water-proofness (destruction due to rainwater quenching can occur when it is subjected to outdoor tests), resistance to loads and resistance to shocks. By using, for example, a material 3 mm thick and having a withstand voltage of 12,000 VAC/mm for 1 minute as an electric characteristic, a product having a dielectric strength of close to 36,000 V/mm for 1 minute can be produced.

And the form of the high-voltage proof insulating sleeve 2*a* is cylindrical. When the external diameter of the resistor element 1 is 12 mm for example, its internal diameter is approximately 12.5 mm. And when its thickness is 3 mm, its external diameter will be approximately 18.5 mm. Length and thickness can be freely adjusted depending on the service voltage.

And as shown in FIG. 2, the length between the both side being bridged at the holding holes 12*b* of the arrangement boards 12*a* is set at approximately 50 mm by taking into account a possible decrease in the insulation value due to soils on the surface or humidity.

It should be remembered that these values are purely exemplary and it is needless to say that these values are not limitative. In the figure, numeral 31 denotes a spring grooved retaining ring. It is used to anchor extractably a high-voltage proof insulating sleeve 2a into a corresponding holding hole 12b of the arrangement board 12a. On the other hand, numeral 32 denotes a spring grooved retaining ring for extractably fit inserting a outer tube 2 into a corresponding high-voltage proof insulating sleeve 2a.

Figure 17:
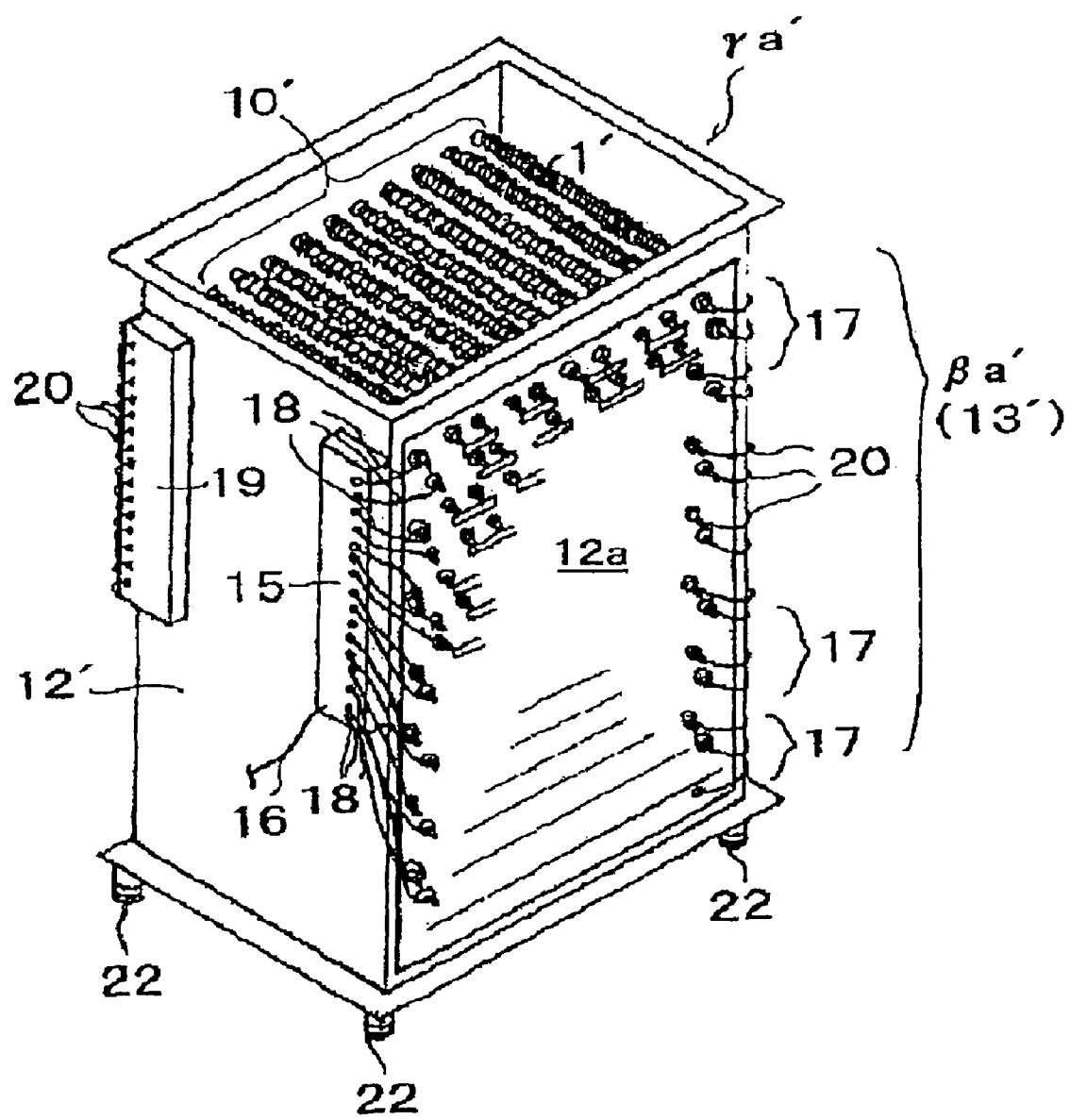
FIG. 17 illustrates Embodiment 2 of the present invention and is a schematic perspective view of a high-voltage resistor apparatus.
Figure 18:
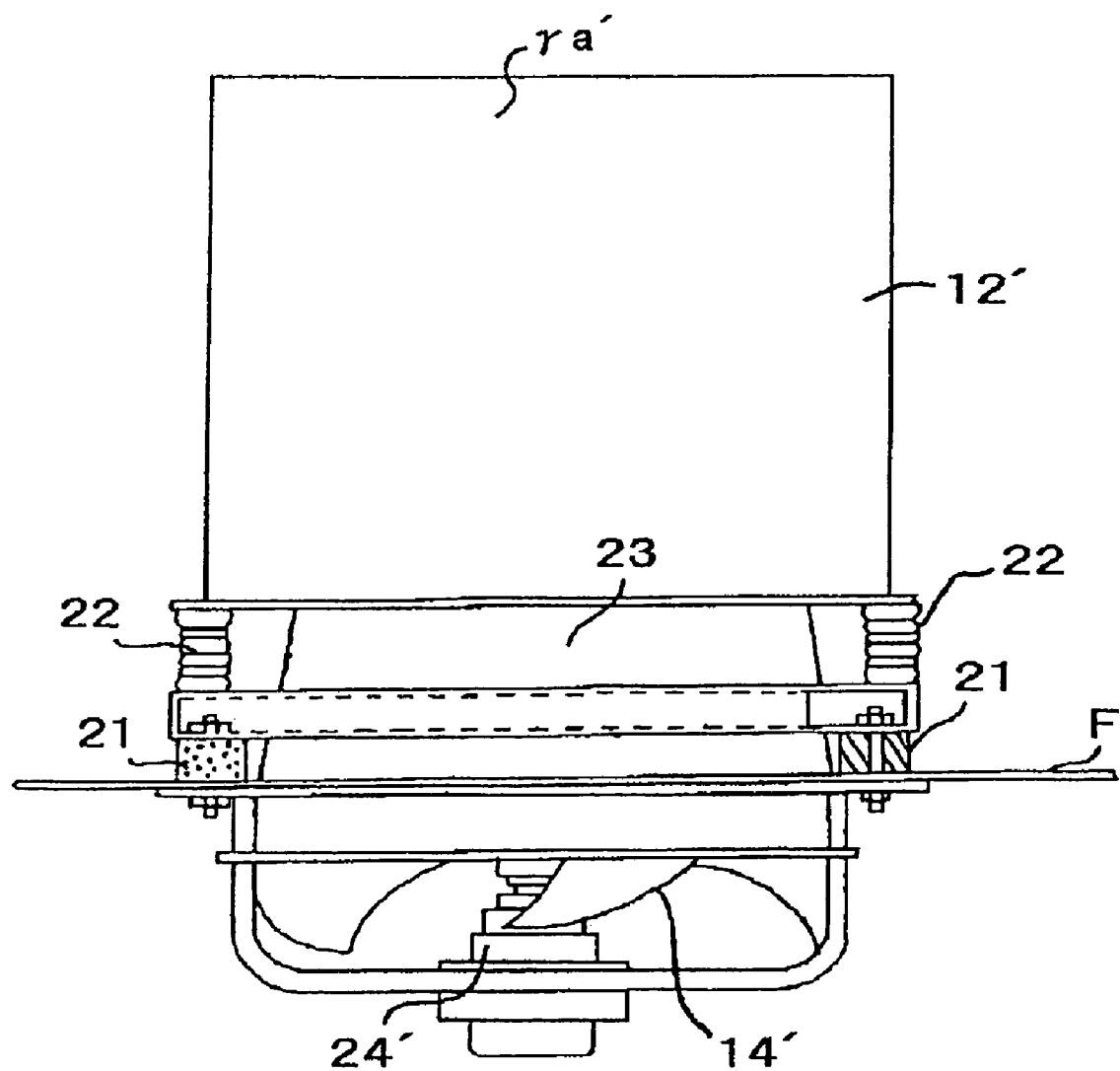
FIG. 18 illustrates Embodiment 2 of the present invention and is a side view of a cooling fan forming part of a high-voltage resistor apparatus.
Figure 19:
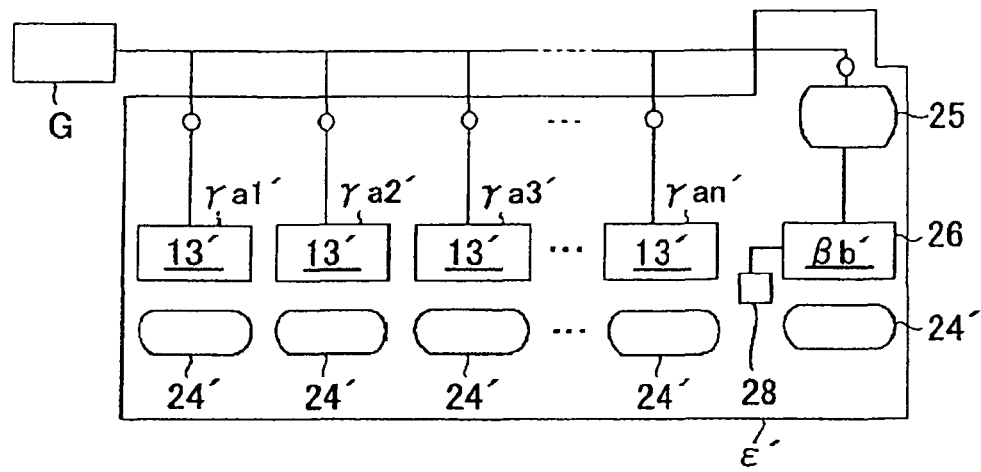
FIG. 19 illustrates Embodiment 2 of the present invention and is a single-line diagram of a high-voltage load system circuit.
Figure 20:
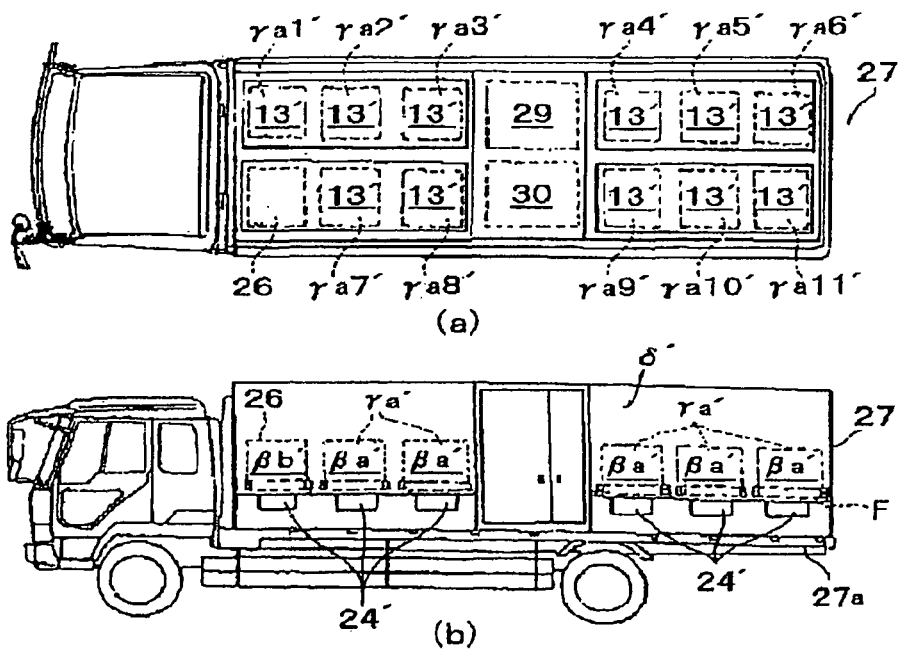
FIG. 20(*a*) and FIG. 20(*b*) illustrate Embodiment 2 of the present invention and are respectively a top plan view and side view of a mobile vehicle housing suspense housing a plurality of rectangular frame boxes in a container loaded on the loading platform of an autotruck.
Figure 21:
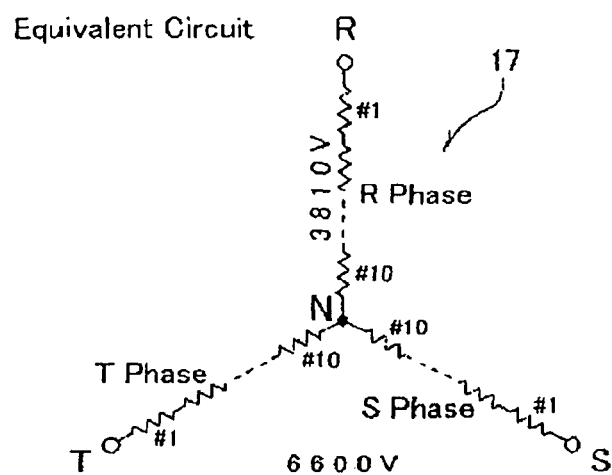
FIG. 21 illustrates Embodiment 2 of the present invention and is an equivalent circuit diagram of Y-connected three-phase resistor circuits.
Figure 22:
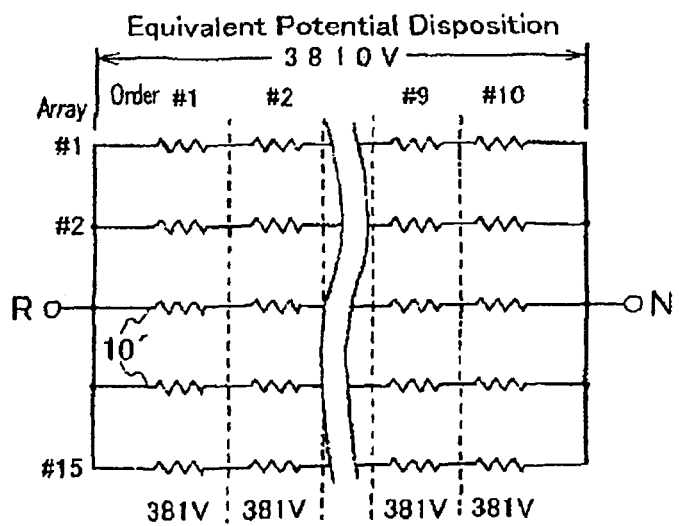
FIG. 22 illustrates Embodiment 2 of the present invention and is a diagram illustrating the equivalent potential disposition of the R-N phase in the high-voltage resistor circuit.
Figure 23:
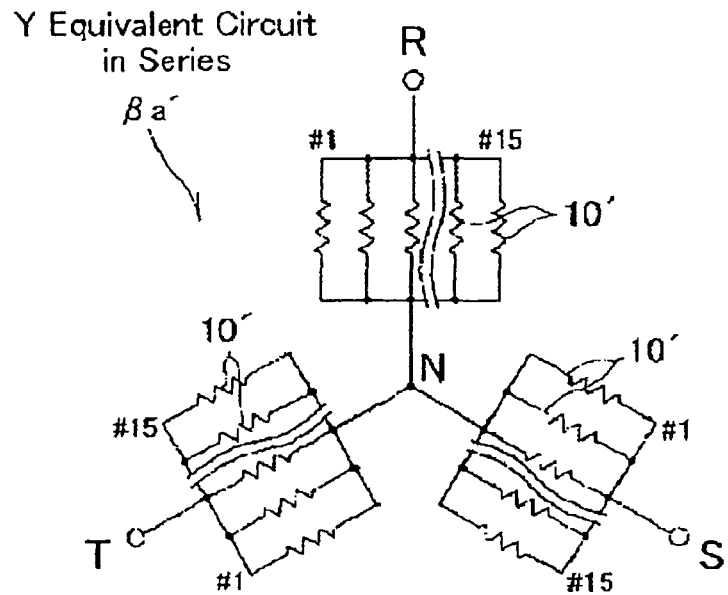
FIG. 23 illustrates Embodiment 2 of the present invention and is an equivalent circuit diagram of Y series connection of a high-voltage resistor apparatus.
Figure 24:
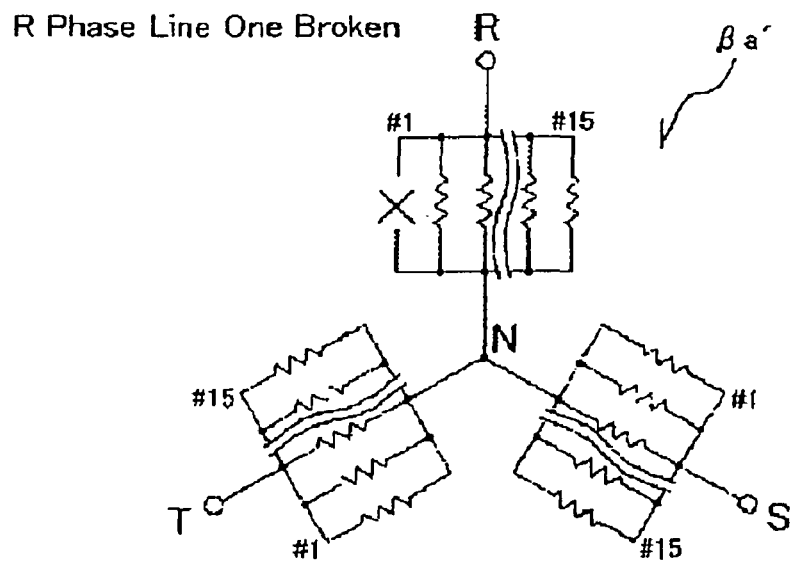
FIG. 24 illustrates Embodiment 2 of the present invention and is an equivalent circuit diagram of Y series connection of a high-voltage resistor apparatus when a single R array phase has been broken.
Figure 25:
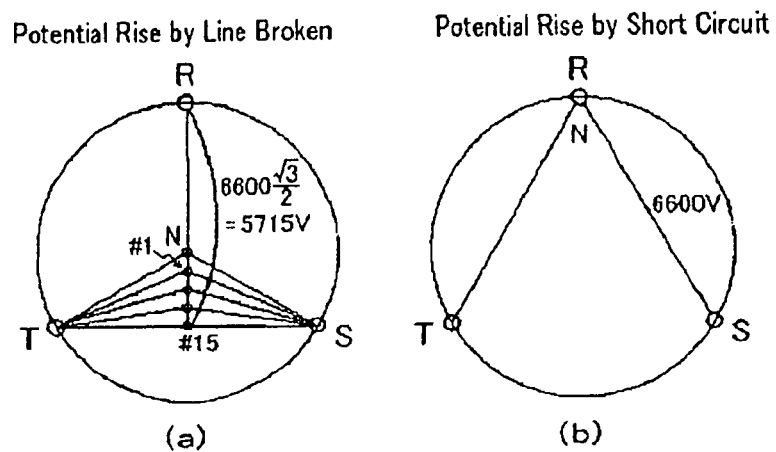
FIG. 25(*a*) and FIG. 25(*b*) illustrate Embodiment 2 of the present invention and are respectively a descriptive representation of potential rise due to a broken line and a descriptive representation of potential rise due to a short-circuit.
Figure 26:
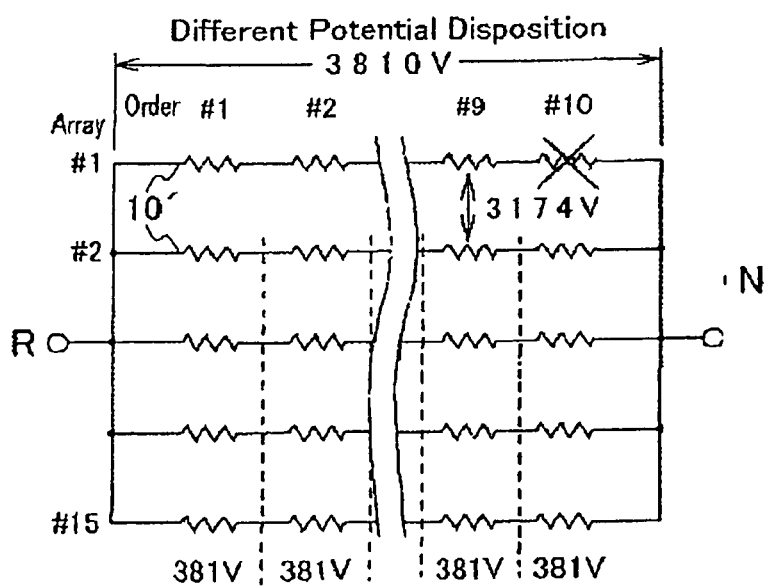
FIG. 26 illustrates Embodiment 2 of the present invention and is a diagram illustrating the different potential disposition of the R-N phase in the high-voltage resistor circuit when a single R array phase has been broken.

Numeral 12a denotes an arrangement board and corresponds to the arrangement board 12a' of the rectangular frame box 12' in FIG. 17 showing a prior art example of resistor array 10'. It can be a support for forming the three-phase resistor circuit described below made considerably smaller by the elimination of fins 9 by connecting with resistor elements 1 the both ends of which are bridge held.

Therefore, the rectangular frame box described below and designed to bridge hold a number of resistor elements made lighter and more compact itself is made smaller to at least one third (⅓).

(Example of Apparatus 1)

Example of apparatus 1 showing an embodiment of the present invention by using the resistor element 1 described above will be described with reference to drawings.

Figure 3:
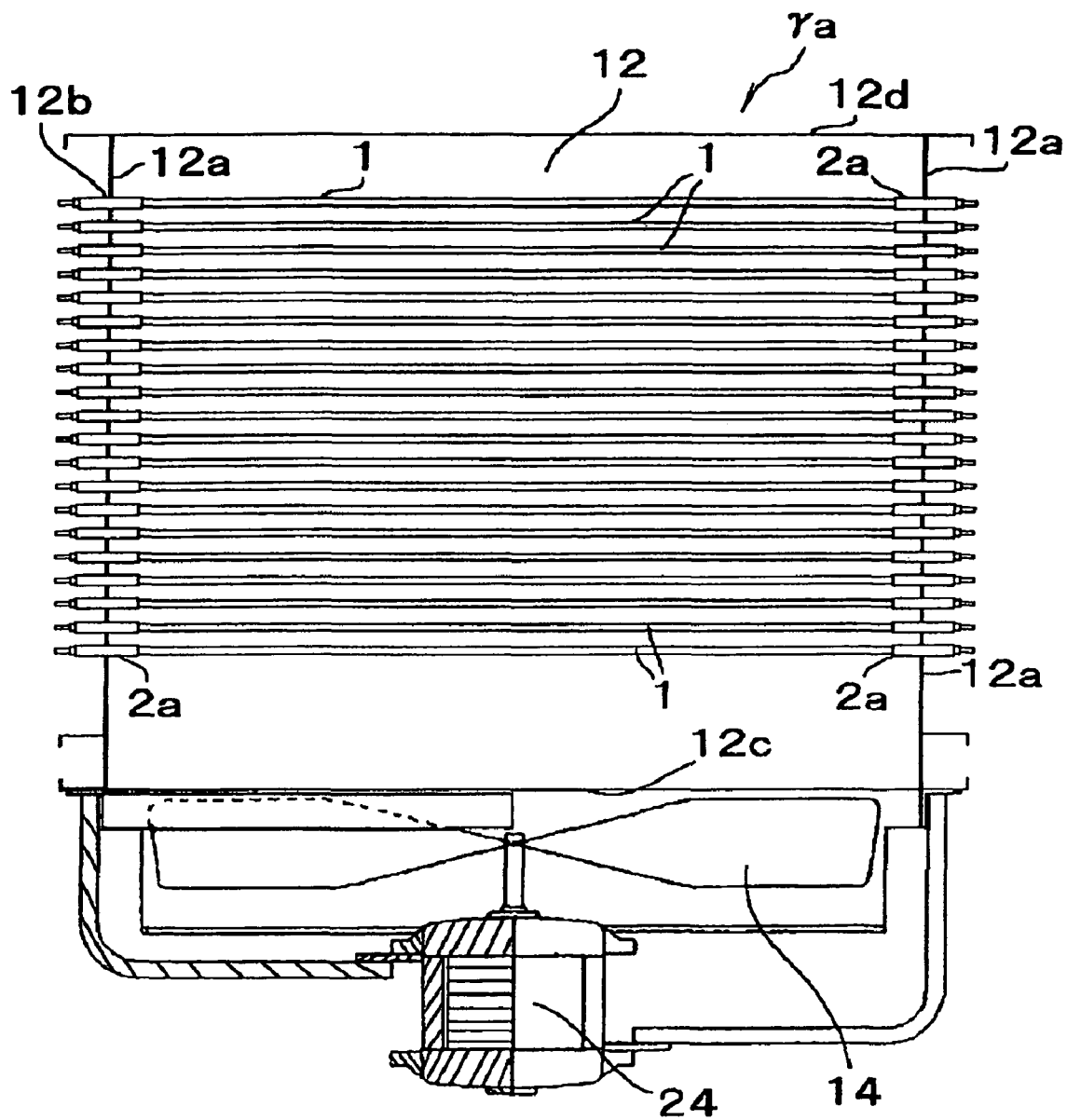
FIG. 3 is a fragmentary cutaway perspective view of Embodiment 1 of the present invention illustrating the high-voltage resistor apparatus wherein the both ends of resistor elements penetrating bridge the arrangement boards on both sides of a chassis ground type rectangular frame box.
Figure 4:
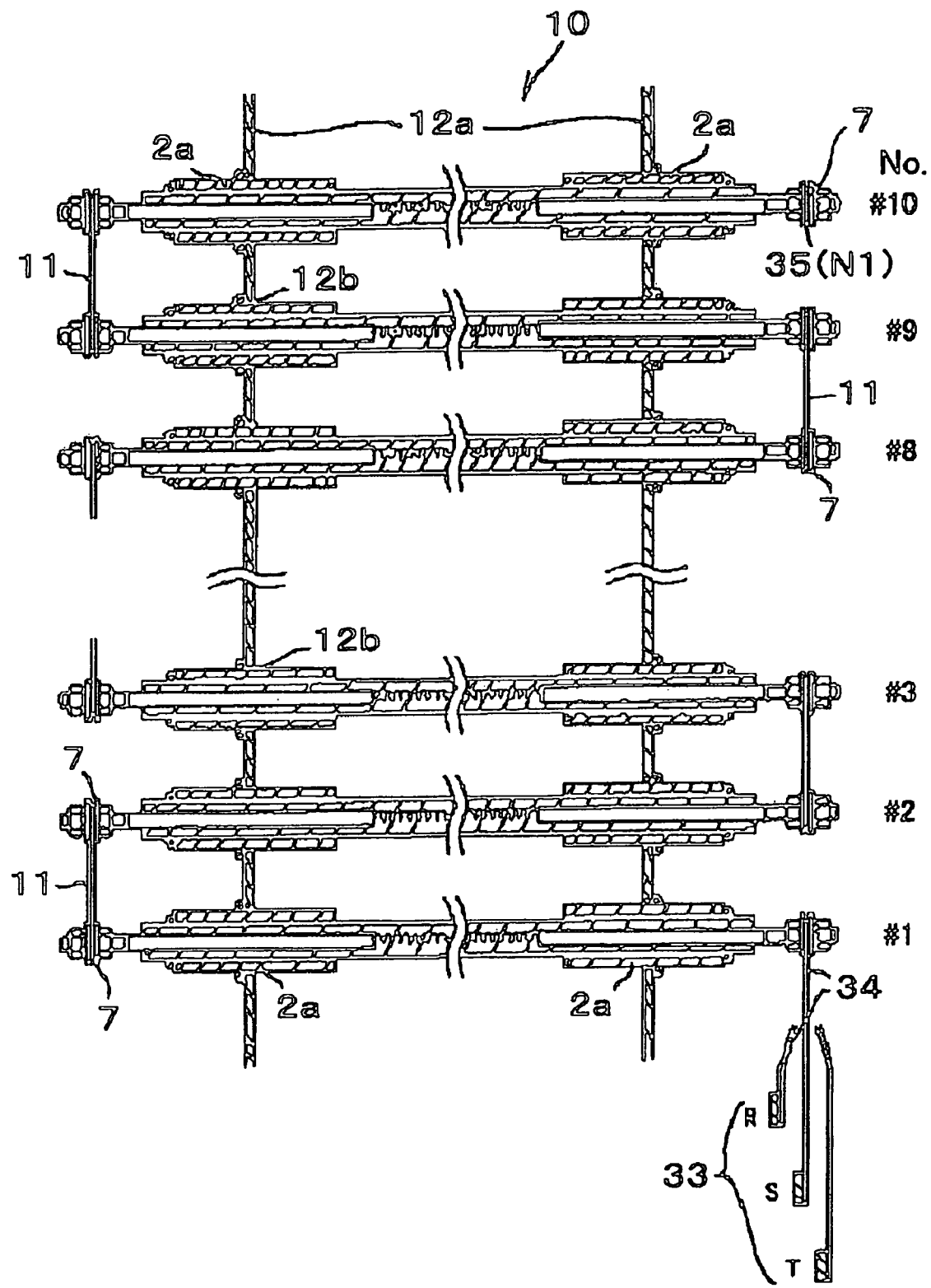
FIG. 4 is a central vertical sectional view of Embodiment 1 of the present invention illustrating the resistor array phase of resistor elements connected in series the both ends of which penetrating bridge the arrangement boards on both sides of a high-voltage resistor apparatus.

FIG. 3 is a partial cutaway perspective view of a high-voltage resistor apparatus constituted by a number of resistor elements the both ends of which penetratingly bridge the arrangement boards on both sides of the rectangular frame box. FIG. 4 is a central vertical sectional view of a resistor array phase consisting of the aforementioned resistor elements connected in series the both ends of which penetrating bridge the arrangement boards.

Figure 5:
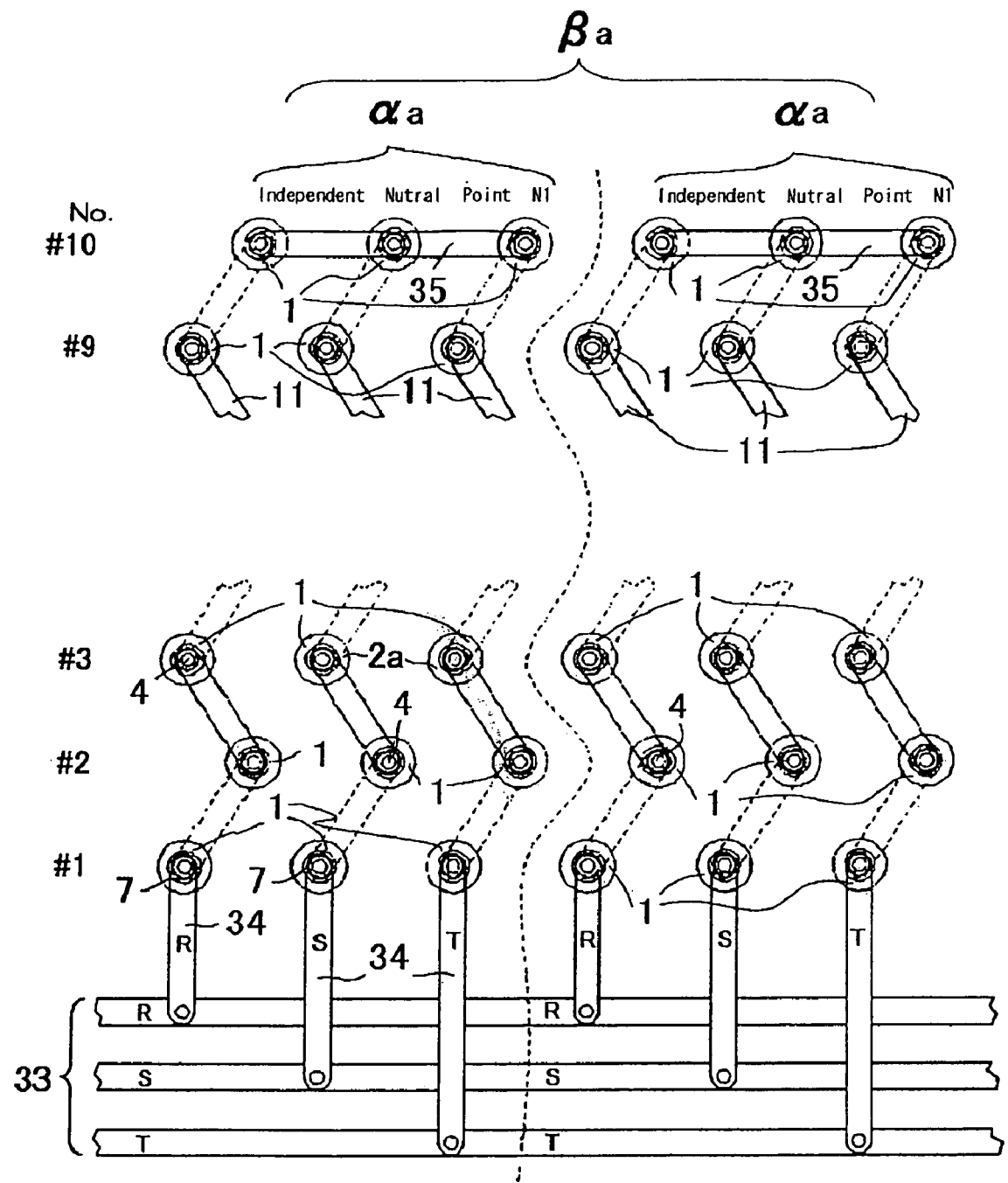
FIG. 5 is a descriptive representation of Embodiment 1 of the present invention illustrating the vertical parallel state of three-phase resistor circuits Y-connecting three-phase connector array phases at isolated and independent neutral points.
Figure 6:
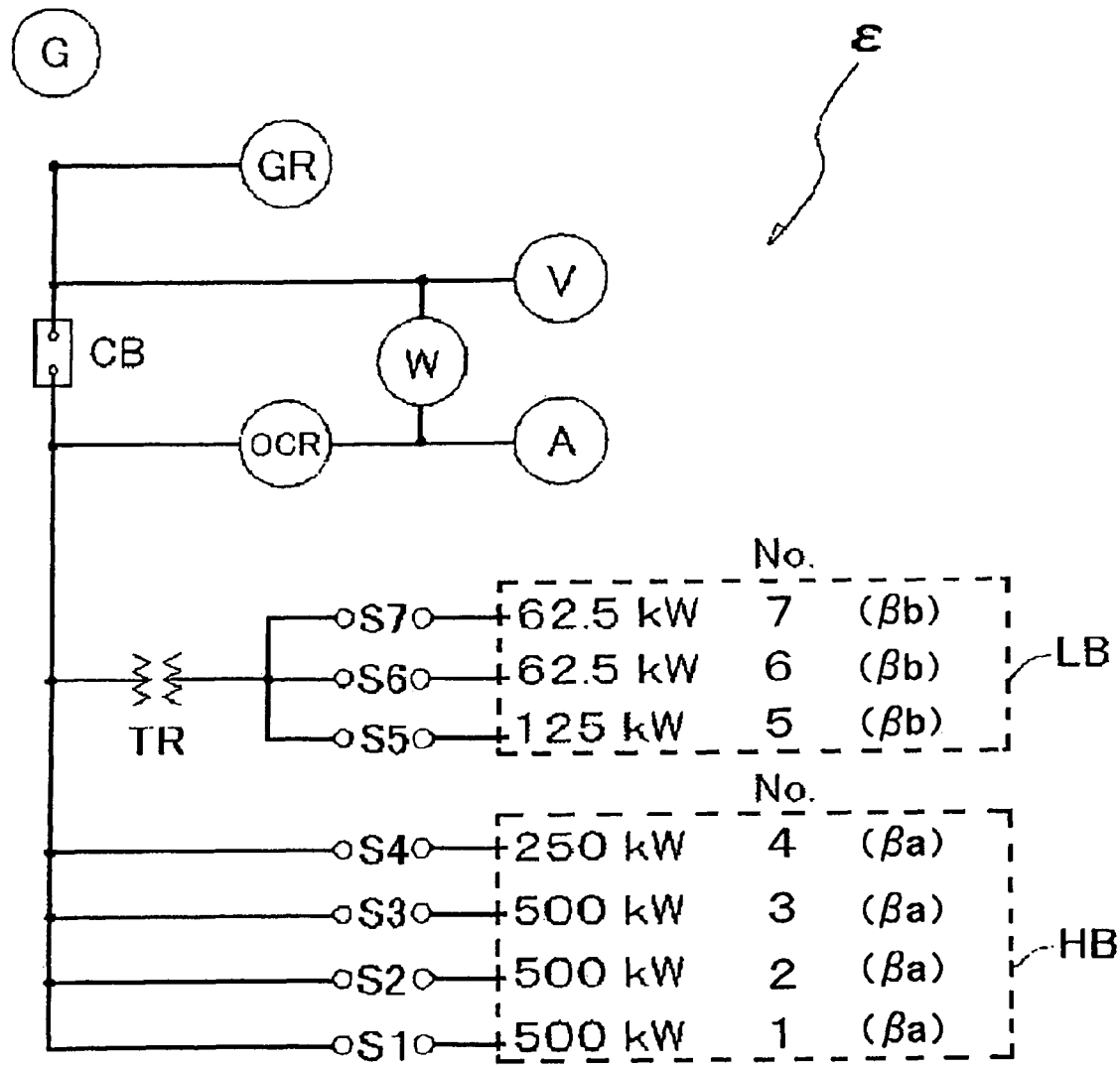
FIG. 6 is a single-line diagram of Embodiment 1 of the present invention illustrating the dry-type high-voltage load system circuit.
Figure 7:
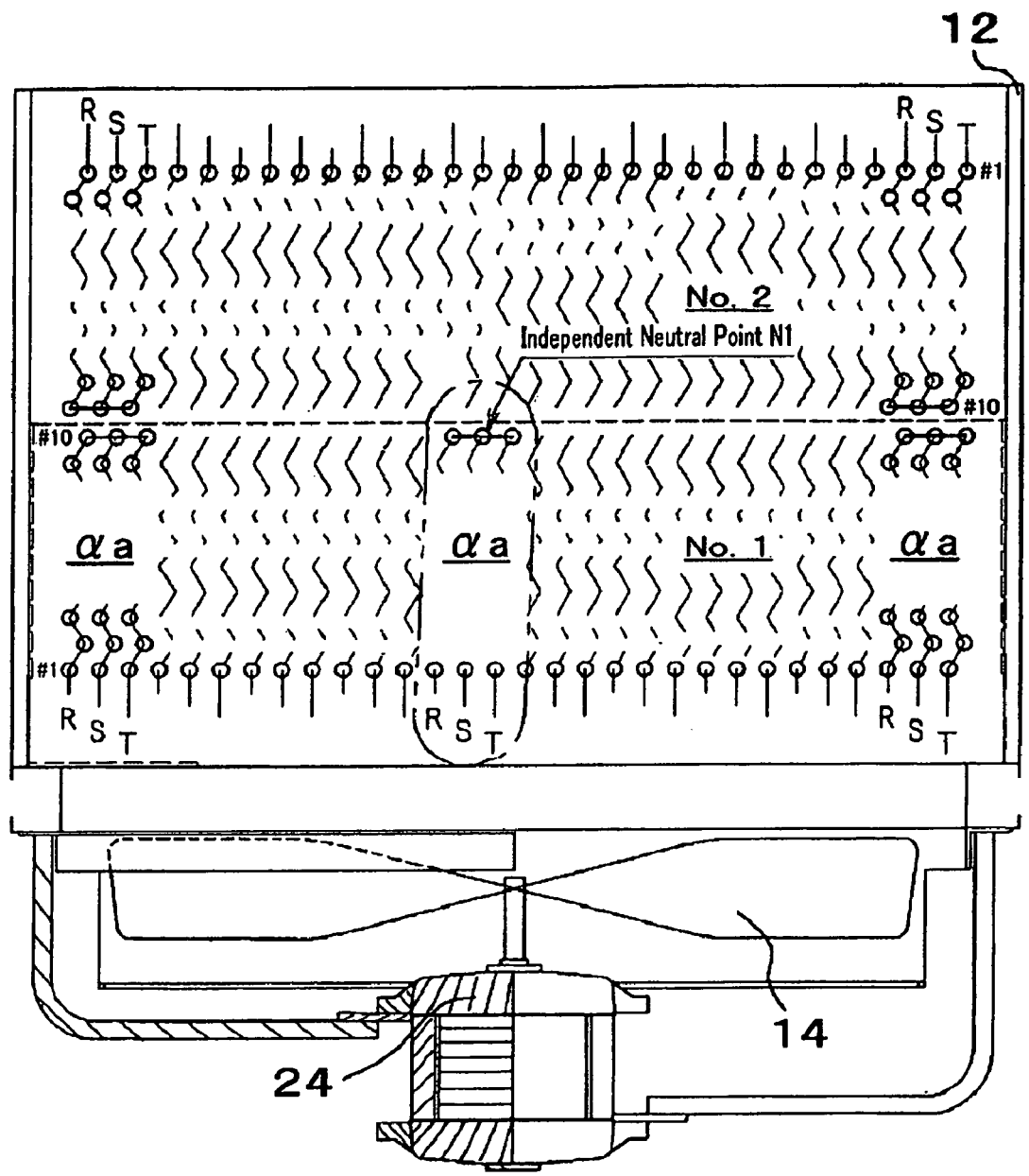
FIG. 7 is a descriptive representation of Embodiment 1 of the present invention illustrating a single vertical rectangular frame box housing two lower-capacity configuration banks constituting a high-voltage bank.
Figure 8:
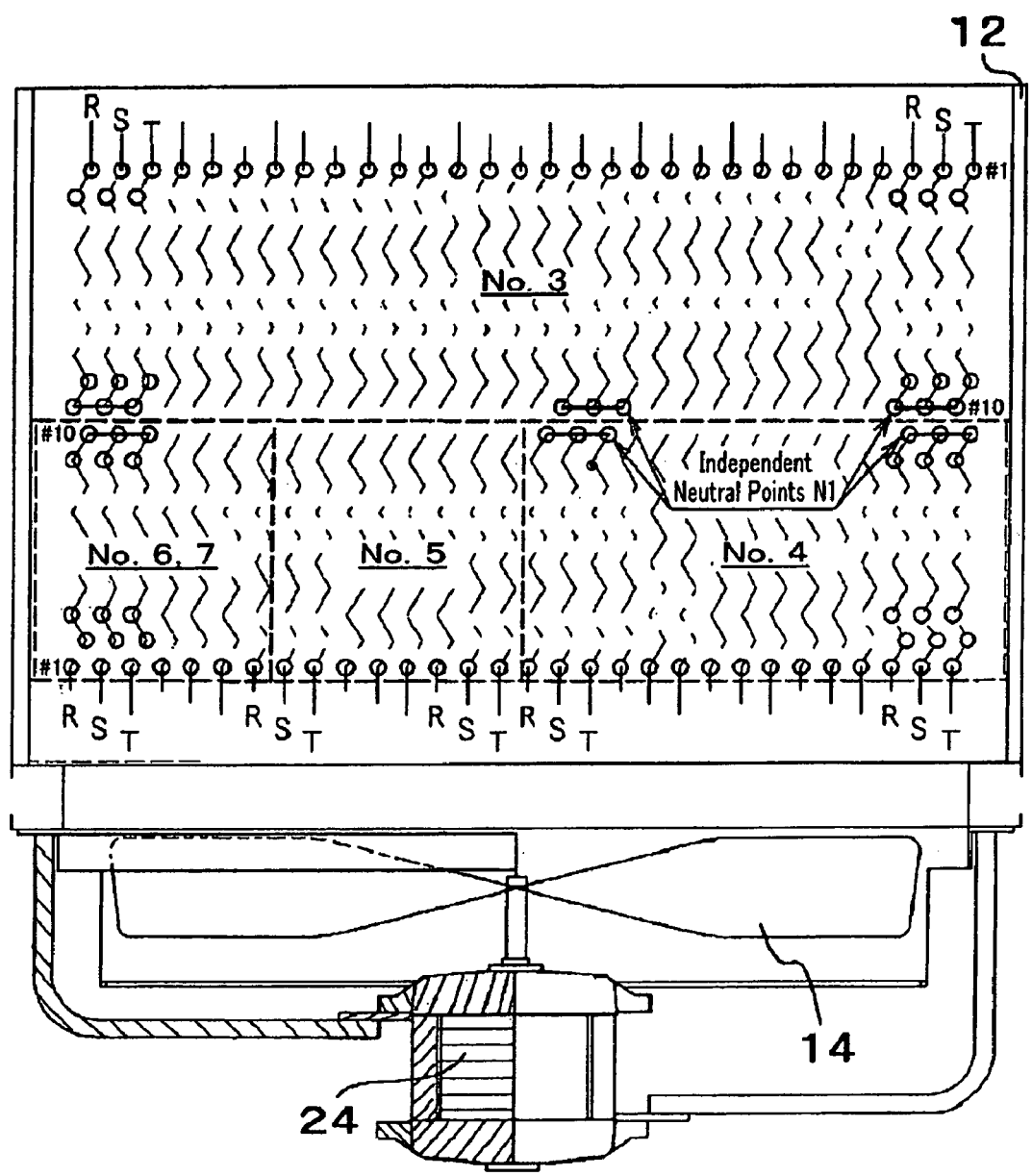
FIG. 8 is a descriptive representation of Embodiment 1 of the present invention illustrating another vertical rectangular frame box housing lower-capacity configuration banks constituting a high-voltage bank and three lower-capacity configuration banks constituting a low-voltage bank.

FIG. 5 is a descriptive illustration of vertical parallel connection wherein the portion encircled by a chain line with two dots in FIG. 7 of a three-phase resistor circuit in which the three-phase resistor array phases are Y-connected by an isolated and independent neutral point N1 is enlarged. FIG. 6 is a single-line diagram of the dry-type high-voltage load system circuit. FIG. 7 is a descriptive representation of a vertical rectangular frame box housing a high-voltage bank consisting of two lower-capacity configuration banks. FIG. 8 is a descriptive representation of another vertical rectangular frame box housing a high-voltage bank consisting of a lower-capacity configuration bank and a low-voltage bank consisting of three lower-capacity configuration banks.

Figure 9:
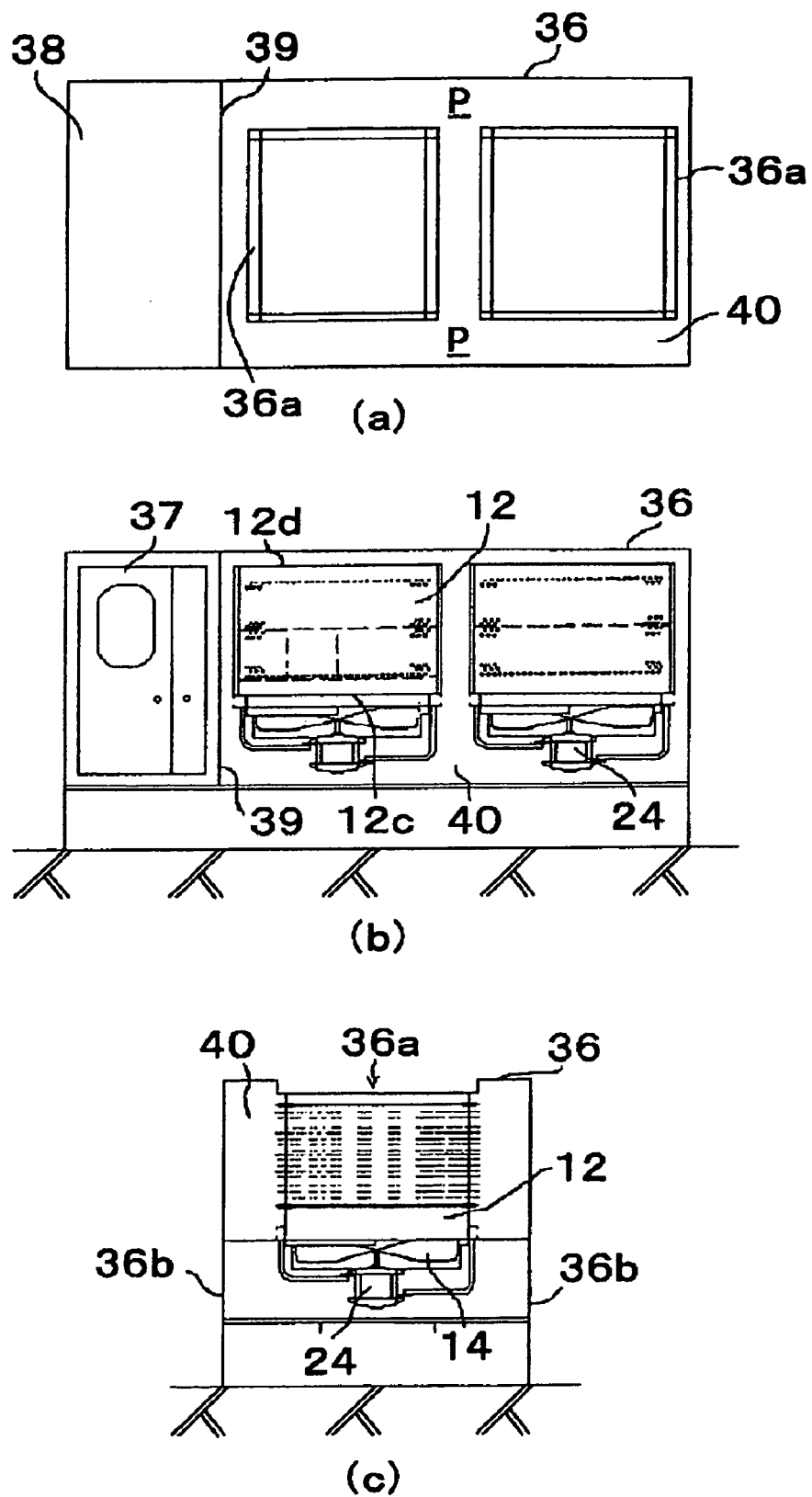
FIG. 9($a$), FIG. 9($b$) and FIG. 9($c$) illustrate Embodiment 1 of the present invention and are respectively a perspective top plan view, a side view and a rear view of a setting-type housing suspense housing two rectangular frame boxes.

FIG. 9(a), FIG. 9(b) and FIG. 9(c) are respectively a perspective top plan view, a side view and a rear view of a setting-type housing suspense housing two vertical rectangular frame boxes. FIG. 10(a), FIG. 10(b) and FIG. 10(c) are a top plan view, a partially perspective side view and a rear view of a mobile vehicle housing suspense housing two rectangular frame boxes in a container loaded on the loading platform of an autotruck. FIG. 11(a) and FIG. 11(b) are respectively a perspective side view and a rear view of a setting-type housing suspense housing a horizontal rectangular frame box. In the figure, numeral 31 denotes the distribution lines of the R, S and T phases connected with the high-voltage power generator G.

Figure 15:
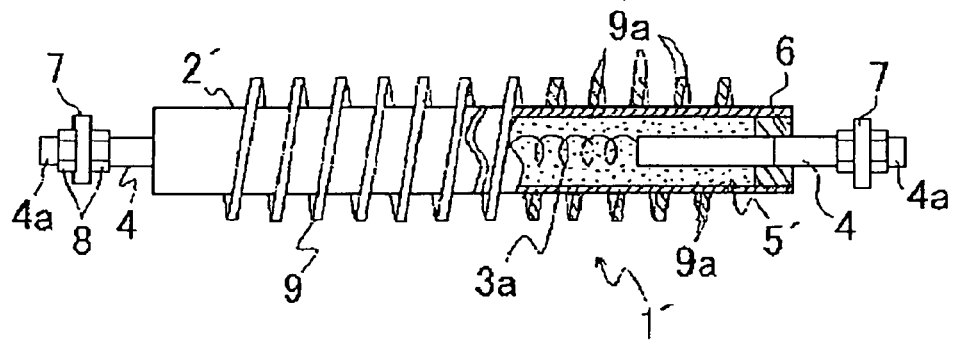
FIG. 15 is a partial cutaway side view of resistor elements according to a prior art example.
Figure 16:
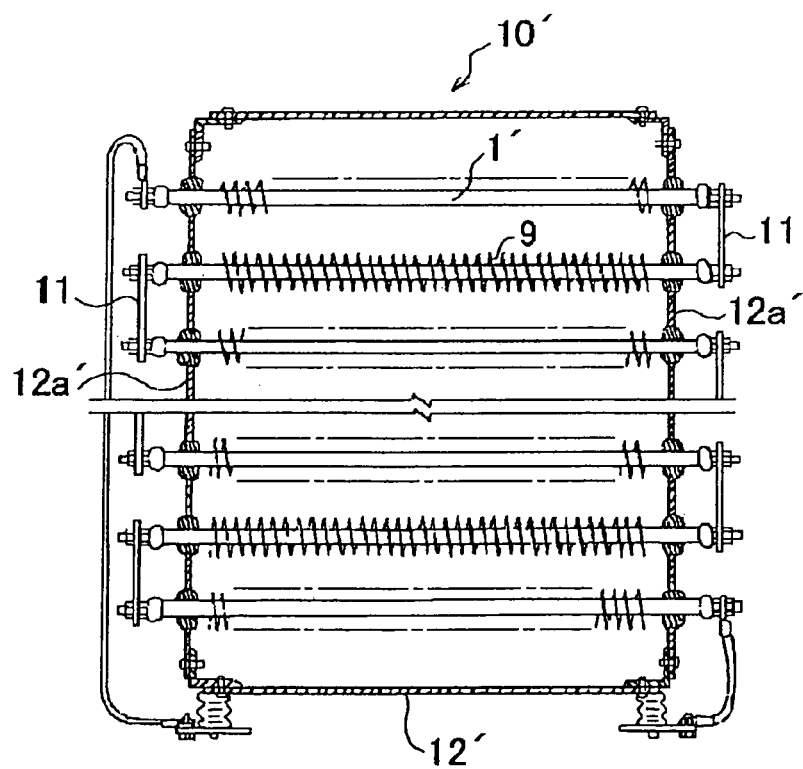
FIG. 16 illustrates Embodiment 2 of the present invention and is a top plan view of a resistor array phase consisting of resistor elements connected in series the both ends of which penetratingly bridge the arrangement boards on both sides of a cutaway rectangular frame box.

As shown in the FIG. 3 and FIG. 4 above, in the high-voltage resistor apparatus γa of the present apparatus example, the resistor array 10 of each of the R, S and T phases is formed by penetratingly bridging the parallel arrangement boards of a chassis ground type vertical rectangular frame box with the both ends of resistor elements b like the one shown in FIG. 15 through high-voltage proof insulating sleeves 2a fit inserted into a plurality of multiple stages of circular holding holes 12b staggered horizontally by half points and vertically in a out-of-reach fashion provided on the parallel arrangement boards, and by connecting in series vertically adjoining two resistor elements 1 on one end side and also alternately vertically adjoining two resistor elements 1 on the other end side with connection menders 11, a cooling air intake opening 12c being provided at the bottom and a heated air exhaust opening 12d being provided at the top.

And as shown in FIG. 5 above, in the present apparatus example, each distribution line 33 of the power cables for R, S and T corresponding to the open connection terminal 7 of #1 of the resistor array 10 for the power cables for R, S and T phases are connected by the connecting lines 34, and the open connection terminal 7 among #10 are Y-connected by means of the neutral point connecting member 35 to constitute isolated independent neutral point N1. In this way, a three-phase resistor circuit αa is formed.

A plurality of three-phase resistor circuits αa are connected in parallel with the three-phase distribution lines 33 of the power cable to constitute a lower-capacity high-voltage resistor circuit βa. The independent neutral point N1 among three-phase resistor circuits αa are not connected together.

Here, the dry-type high-voltage load system circuit ε constituted by a lower-capacity high-voltage resistor circuit βa adopted as a lower-capacity configuration bank 13 will be described with reference to FIG. 6.

The dry-type high-voltage load system circuit ε constitutes an electric circuit system wherein a low-voltage bank LB consisting of a plurality of lower-capacity configuration banks 13/Nos. 5-7 of a lower-capacity low-voltage resistor circuit βb consisting of a plurality of three-phase resistor circuits αa connected in series with each of the switches S5-S7 branching from and connected in parallel with the output terminal of a transformer TR and a high-voltage bank HB consisting of a plurality of lower-capacity configuration banks 13/Nos. 1-4 of a lower-capacity high-voltage resistor circuit βa consisting of a plurality of three-phase resistor circuits αa connected respectively in parallel with a plurality of parallel switches S1-S4 are connected in parallel with the high-voltage power generator G through the central breaker CB.

And the dry-type high-voltage load system circuit ε connects mutually in parallel a voltmeter V with the power cable from the high-voltage power generator G on one side of the central breaker CB and with an ammeter A through an over-current relay OCR with the power cable coming from the transformer TR on the other side, connects the wattmeter W with both the ammeter A and the voltmeter V on one hand, and connects the ground relay GR with the power cable linking the high-voltage power generator G and the voltmeter V on the other hand.

The high-voltage bank HB, at a service voltage of 6,600 V, constitutes a three-phase resistor circuit αa constituted by Y connecting three arrays each consisting of ten resistor elements 1 of 381 V and 1.67 kW for example connected in series with the resistor array 10, the neutral point N being an independent neutral point N1. The capacity of the three-phase resistor circuit αa will be 50.1 kW, and when lower-capacity high-voltage resistor circuits βa consisting of ten units R, S and T are connected in parallel with the distribution lines 33, a lower-capacity configuration bank 13 of 500 kW can be constituted. In the case of a lower-capacity high-voltage resistor circuit βa of 250 kV, five three-phase resistor circuits αa are connected in parallel.

The low-voltage bank LB is constituted by two 62.5 kW lower-capacity configuration banks 13/Nos. 6-7 and a 12.5 kW lower-capacity configuration bank 13/No. 5 connected in parallel, a lower-capacity low-voltage resistor circuit βb consisting of a plurality of three-phase resistor circuits αb connected in parallel serving as the basis of forming, for example, a 62.5 kW lower-capacity configuration bank 13 or a 125 kW lower-capacity configuration bank 13.

The rectangular frame box 12 housing the lower-capacity configuration banks 13/Nos. 1-4 of the lower-capacity high-voltage resistor circuit βa and the lower-capacity configuration banks 13/Nos. 5-7 of the lower-capacity low-voltage resistor circuit βb can be classified into the vertical axis type and the horizontal axis type by the direction of the axis of the air blower 24, the former being a large capacity type consisting a plurality of rectangular frame box 12 and the latter being used for a lower-capacity type. The four sides on the front surface of the arrangement board 12*a* are reserved for wiring routes P. The installation type and the vehicle mounted type wherein the switches S1-S7, the central breaker CB, the transformer TR and other transformers and the control panel are housed in a cubicle are shown respectively in FIG. 9 and FIG. 10.

<Vertical Rectangular Frame Box>

And for large capacity, a vertical rectangular frame box 12 houses a lower-capacity configuration bank 13/No. 1 on the lower half and a lower-capacity configuration bank 13/No. 2 respectively of 500 kW on the upper half (see FIG. 7). Another vertical rectangular frame box 12 houses a high voltage bank HB/No. 3 of 500 kW and low-voltage banks LB/Nos. 4, 5, 6 and 7 of respectively 250 kW, 125 kW, 62.5 kW and 62.5 kW (see FIG. 8).

[Installation Type]

The two vertical rectangular frame boxes 12 are housed in a load room 40 that adjoins through a partition wall 39 an appliance room 38 wherein a transformer TR and switches S1-S7 are installed on the external end wall surface on which a control panel and an instrument panel are fitted and a door 37 is fitted, and in the same load room 40 wherein a heated air exhaust window 36*a* and a cooling air intake window 36*b* that can be freely opened and closed are provided at positions on the top surface and the lateral surface on both sides corresponding to a heated air exhaust opening 12*d* and an air blower 24 of each vertical rectangular frame box 12 within a containerized installation-type housing 36.

[Vehicle Mounted Type]

The two vertical rectangular frame boxes 12 are housed in a load room 49 that adjoins through a partition wall 48 of an appliance room 47 wherein a transformer TR and switches S1-S7 are installed and a door 43 is fitted and adjoining through a partition wall 45 a control room 44 wherein a control panel and an instrument panel are installed and a door 46 is fitted from the front side of an all-weather hermetic container 42 placed on the loading platform 41*a* of an autotruck 41, and in the same load room 49 wherein a heated air exhaust window 42*a* and a cooling air intake window 42*b* that can be freely opened and closed are provided at positions on the top surface and the lateral surface on both sides corresponding to a heated air exhaust opening 12*d* and an air blower 24 of each vertical rectangular frame box 12 within a containerized installation-type housing 36.

<Horizontal Rectangular Frame Box>

[Installation Type]

Figure 11:
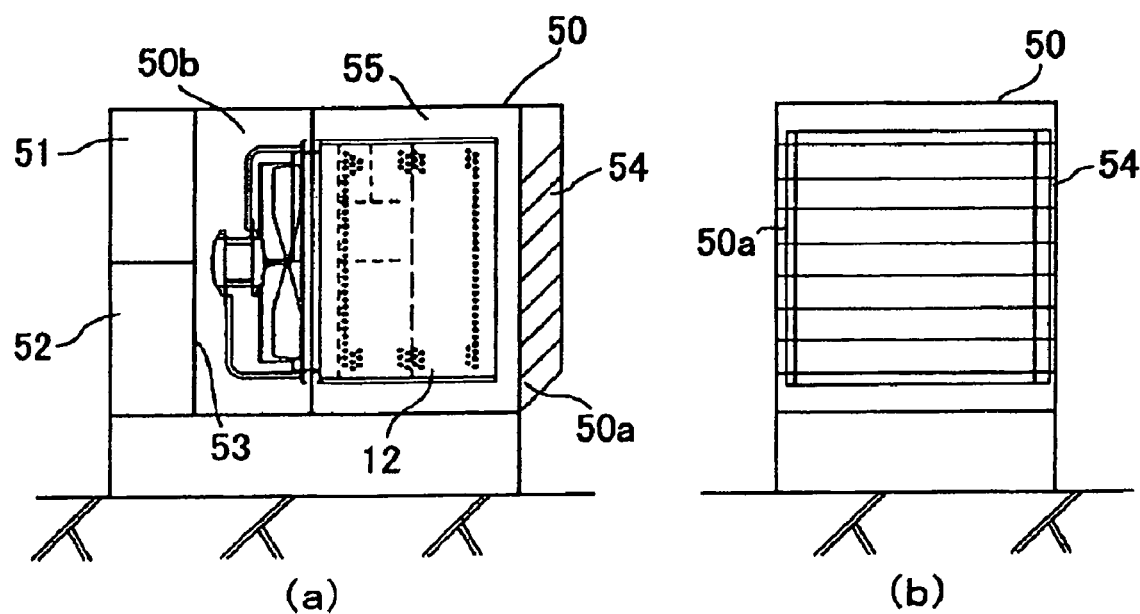
FIG. 11($a$), and FIG. 11($b$) illustrate Embodiment 1 of the present invention and are respectively a perspective side view and a rear view of a setting-type housing suspense housing a rectangular frame box.

As shown in FIG. 11, a horizontal rectangular frame box 12 is suspense housed in a load room 55 that adjoins through a partition wall 53 upper and lower compartments 51 and 52 wherein a control panel and an instrument panel are installed for the upper compartment and a transformer TR, switches S1-Sn (n is a natural number) and a swing door is installed for the lower compartment, and in the same load room 55 wherein a shutter-type heated air exhaust window 54 of a shutter-type and a cooling air intake window 50*b* that can be freely opened and closed are provided on all the rear opening (wall) 50*a* and on the lateral walls each corresponding to a heated air exhaust opening 12*d* and an air blower 24 of each horizontal rectangular frame box 12 on one end side in an installation-type housing 50.

[Vehicle Mounted Type]

Figure 10:
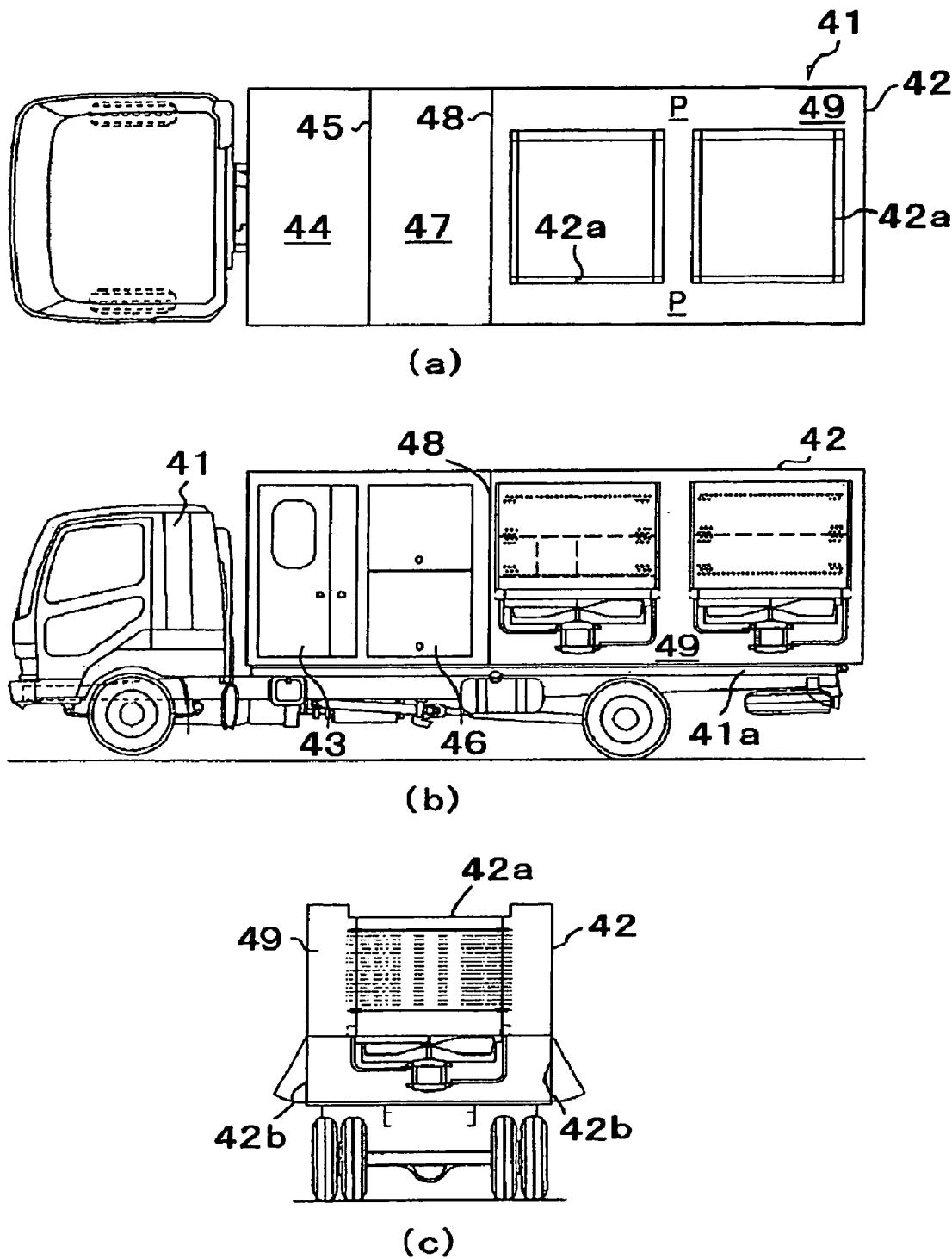
FIG. 10($a$), FIG. 10($b$) and FIG. 10($c$) illustrate Embodiment 1 of the present invention and are respectively a top plan view, a partially perspective side view and a rear view of a mobile vehicle housing suspense housing two rectangular frame boxes in a container loaded on the loading platform of an autotruck.

A horizontal rectangular frame box 12 is suspense housed in a load room 55 not shown and that adjoins through a partition an appliance room wherein a control panel and an instrument panel are installed and a swing door is installed following a control room wherein a control panel, an instrument panel and a swing door is installed from the front side of an all-weather hermetic container shown in FIG. 10(*a*), FIG. 10(*b*) and FIG. 10(*c*) loaded on the loading platform of a small autotruck, and in the same load room 55 wherein a heated air exhaust window of a shutter-type and a cooling air intake window that can be freely opened and closed are provided on all the rear opening wall and on the lateral walls each corresponding to a heated air exhaust opening and an air blower of each horizontal rectangular frame box 12 on one end side in an installation-type housing 50.

Figure 27:
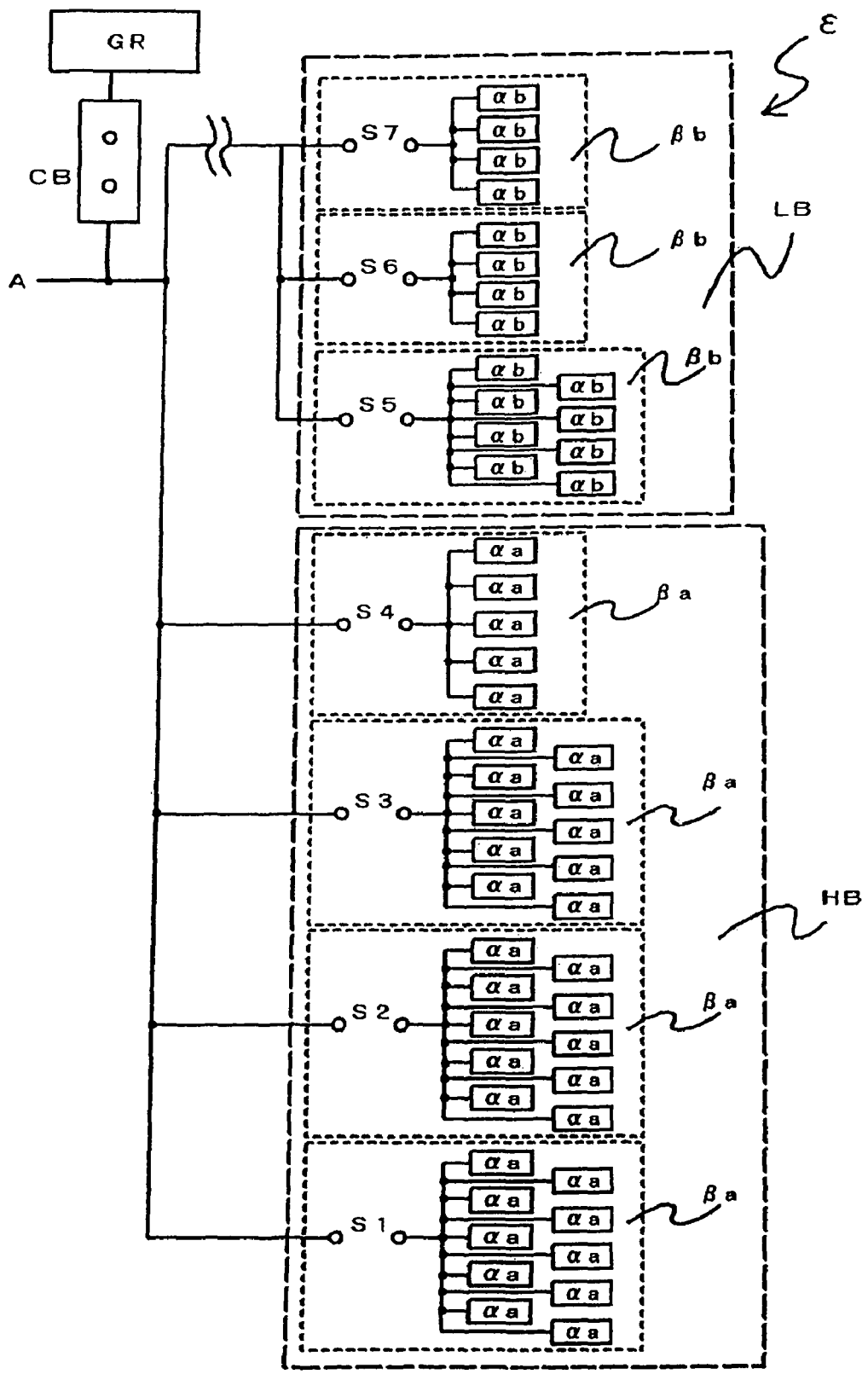
FIG. 27 is a schematic diagram showing a low voltage bank parallel to a high-voltage bank wherein each bank is comprised of lower-capacity configuration banks.

Referring to FIG. 27 a high level schematic of the first apparatus example is presented wherein components discussed above are shown. The high-voltage load system circuit ε includes the low-voltage bank LB which is composed of a plurality of the lower-capacity configuration banks formed of the low-voltage resistor circuits βb each formed of a plurality of the low-voltage three-phase resistor circuits αb connected via the plurality of the switches S5-S7 in parallel to an output terminal of a transformer input terminal (not shown) which is in turn connected to the central breaker CB. The high-voltage bank HB includes of a plurality of lower-capacity configuration banks formed of the high-voltage resistor circuits βa each of which includes a plurality of the high-voltage three-phase resistor circuits αa connected to the switches S1-S4. The low-voltage bank LB and the high-voltage bank IIB are thus connected in parallel to the high-voltage power generator GR through the central breaker CB. The low-voltage three-phase resistor circuits αb and the high-voltage three-phase resistor circuits αa each are comprised of resistor arrays in three phases, each of the resistor arrays being comprised of resistor elements 1 connected in series, as discussed above, in a form of a Y-connection in which three of the resistor arrays are concentrated for reconciliation of their phases so that an isolated and independent neutral point unconnected to those of the other three-phase resistor circuits is formed as discussed above. Alternatively, the resistor arrays are connected in a form of a Δ-connection in which each terminal of the resistor arrays in three phases is connected to each of in-phase branch distribution lines of a power cable as discussed above.

Method Example 1

Method example 1 showing an embodiment of the present invention applied on the aforementioned apparatus example 1 will be described below.

The high-voltage bank HB is used for coarse adjustment for controlling the power consumption of the high-voltage power generator G, and the low-voltage bank LB is used for fine adjustment through the transformer TR. Specifically, the power received from the high-voltage power generator G is switched on and off by the switches S1-S4 for high voltage through the central breaker CB to turn on and off the supply of power to the high-voltage bank HB, and the switches S5-S7 for low-voltage use the secondary output of the transformer TR connected in parallel with the switches S1-S4 for high-voltage use switch on and off the supply of power to the low-voltage bank LB.

In the lower-capacity high-voltage resistor circuit βa having three-phase resistor circuits αa Y-connected at an isolated and independent neutral node N1 with the group of resistor elements 1 having the aforementioned structure, the present method example limits the electric adverse effects of the failure of a resistor element 1 to an independent neutral node N1, and contains such adverse effects within the three-phase resistor circuit αa to which it belongs, and therefore the present method example can prevent any chain breaking from spreading to the other adjoining three-phase resistor circuits αa.

And even if a resistor element 1 of a three-phase resistor circuit αa breaks due to arc discharges or natural degradation, because of its discharge-resistant structure, arc discharges between resistor elements 1 of any resistor arrays 10 within the three-phase resistor circuit αa are suppressed. In addition, due to isolated and independent neutral points N1, arc discharges with the resistor elements 1 of other parallel three-phase resistor circuits αa are suppressed, and the chain breaking do not spread to other three-phase resistor circuits αa. Thus, safe and stable operation and control is assured and highly dependable load tests are guaranteed.

Due to the employment of the resistor element 1 and the compactification of lower-capacity high- and low-voltage resistor circuits βa, βb, it has become possible to house all the high-voltage banks HB and low-voltage banks LB in two vertical rectangular frame boxes 12, and the number of air blowers 24 can now be limited to two units. Thus; the initial investments and running costs can be sharply reduced for more economy, and in the case of the installation type, the installation space and cubic volume are reduced to one third (⅓) of the prior art example, and in the vehicle mounted type, due to the compactification of vehicles used, their maneuverability is enhanced because they will no longer be subjected to the width restriction of the roads leading to the site.

Apparatus Example 2

The apparatus example 2 showing an embodiment of the present invention using the aforementioned resistor element 1 will be described with reference to drawings.

Figure 12:
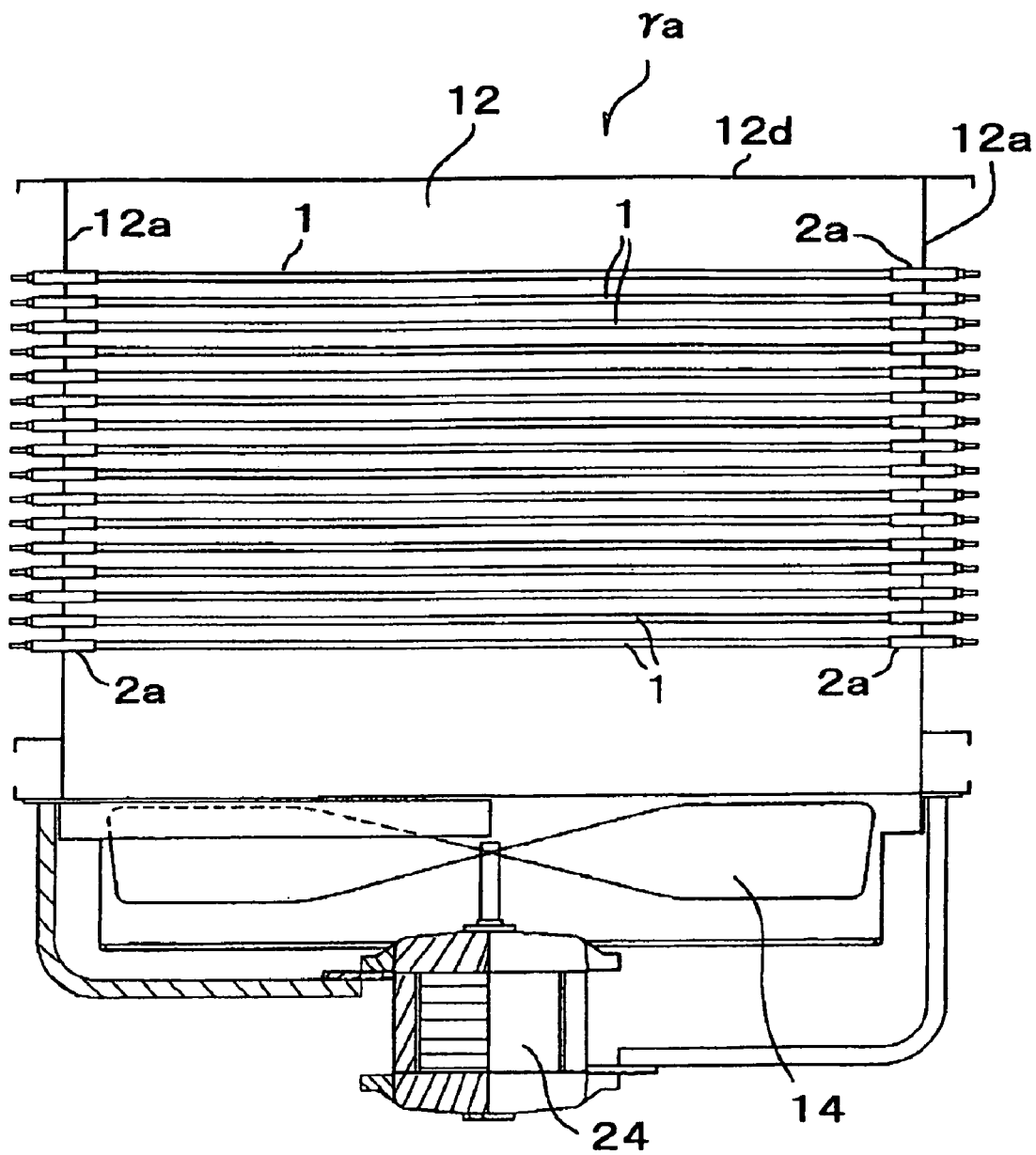
FIG. 12 illustrates Embodiment 2 of the present invention and is a partial cutaway perspective view of a high-voltage resistor apparatus constituted by resistor elements whose both ends penetratingly bridge the arrangement boards on both sides of a chassis ground type rectangular frame box.
Figure 13:
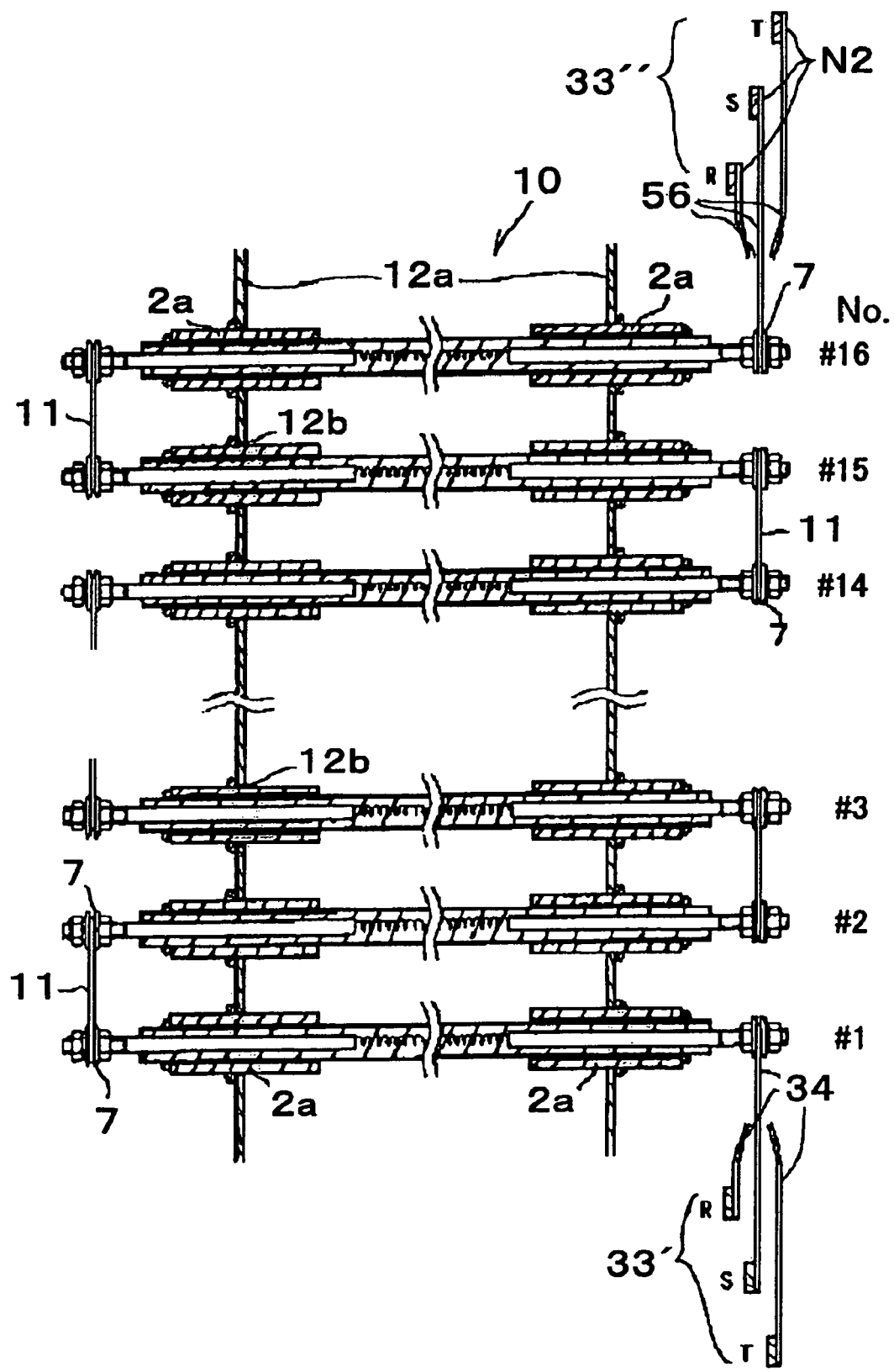
FIG. 13 illustrates Embodiment 2 of the present invention and is central vertical sectional view of a resistor array phase of resistor elements connected in series the both ends of which penetratingly bridge the arrangement boards of Δ-connection.
Figure 14:
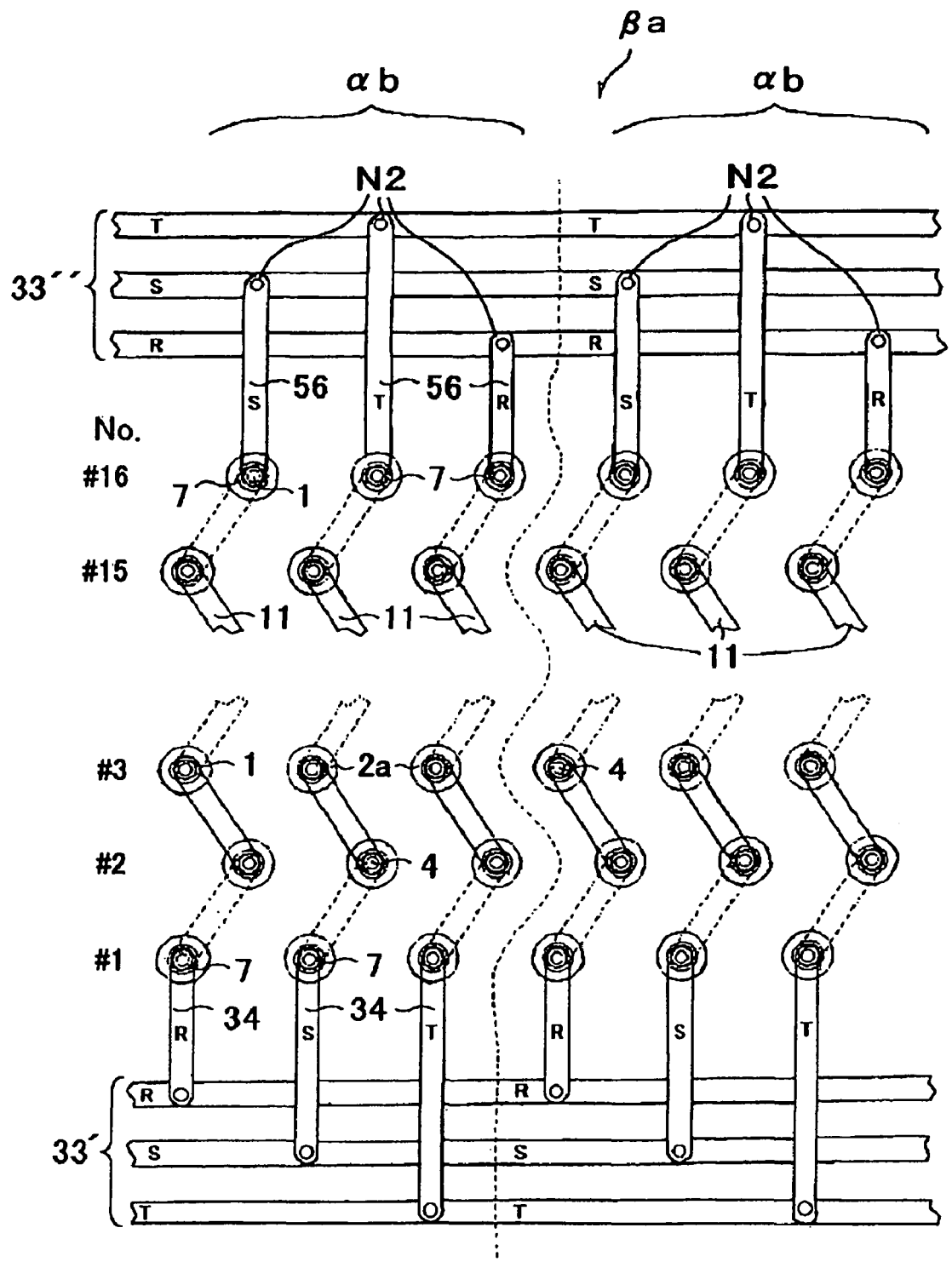
FIG. 14 illustrates Embodiment 2 of the present invention and is a descriptive representation of the vertical parallel connection of three-phase resistor circuits Δ-connecting three-phase resistor array phases by node connectors.

FIG. 12 is a partial cutaway perspective view of the high-voltage resistor apparatus wherein the both ends of resistor elements penetratingly bridge the arrangement boards on both sides of a rectangular frame box. FIG. 13 is a central vertical sectional view of a resistor array phase of the aforementioned resistor elements connected in series the both ends of which penetratingly bridge an arrangement board of Δ-connection. FIG. 14 is a descriptive representation of the vertical parallel state of a three-phase resistor circuit constituted by Δ-connecting by node connectors three-phase resistor array phase.

The difference between the present apparatus example and the aforementioned apparatus example 1 is that the open connection terminal 7 with the resistor arrays 10 for R, S and T and the main distribution lines 33' of the power cable are connected by the connecting lines 34, and the open connection terminal 7 with #16 are connected with S, T and R of various branch distribution lines 33" of another power cable by the connecting members 56 for the nodes N2 to constitute a three-phase resistor circuit αb.

In so doing, the resistor arrays 10 consisting of sixteen resistor elements 1 of, for example, 412.5V, 1.74 kW are Δ-connected by the unit of three vertical columns to constitute a three-phase resistor circuit αb of, for example, a capacity of 83.52 kW, and three such three-phase resistor circuits are connected in parallel to constitute a lower-capacity configuration bank of for example 250 kW or six such circuits are connected to constitute three lower-capacity configuration banks of for example 500 kW. These lower-capacity configuration banks constitute respectively a lower-capacity high-voltage resistor circuit βa, a plurality of which then are connected in parallel to constitute a high-voltage bank HB. This high-voltage bank HE and a low-voltage bank LB are connected in parallel between the three-phase main distribution line 33' and the three-phase branch distribution line 33" to form the present dry-type high-voltage load system apparatus δ provided with a dry-type high-voltage load system circuits. Otherwise, both apparatus examples are similarly constituted.

Similarly, as for the low-voltage bank LB, a plurality of lower-capacity low-voltage resistor circuits βb formed by connecting in parallel a plurality of three-phase resistor circuits αb are respectively connected in parallel to form a lower-capacity configuration bank 13 of for example 62.5 kW or a lower-capacity configuration bank 13 of for example 125 kW, and the parallel connection of two 62.5 kW lower-capacity configuration banks 13/Nos. 6-7 and one 125 kW lower-capacity configuration bank 13/No. 5 is similar in the installation fitting and the structure of the loading platform for the aforementioned [installation type] and [vehicle mounted type].

Method Example 2

The method example 2 showing an embodiment of the present invention by applying the aforementioned apparatus example 2 will be described below.

The present method example is similar to the aforementioned method example 1 as far as operation and manipulation are concerned. A lower-capacity high-voltage resistor circuit βa constituted by a plurality of three-phase resistor circuits αb formed by Δ-connecting a plurality of resistor elements having the aforementioned special structure can limit the electric adverse effects of possible rupture of any resistor element 1 to each resistor array 10 within the three-phase resistor circuit αb to which the broken resistor element belongs and can prevent the spread of chaining disconnection to other adjoining parallel resistor array 10 or to other three-phase resistor circuit αb through the node N2.

Similarly, when a resistor element 1 of a three-phase resistor circuit αb is broken due to arc discharges or natural degradation, due to its discharge-resistant structure, arc discharges between resistor elements 1 of any resistor arrays 10 within the three-phase resistor circuit αb are suppressed. In addition, arc discharges with the resistor elements 1 of other parallel three-phase resistor circuits αb are suppressed, and the chain breaking do not spread to other three-phase resistor circuits αb. Thus, safe and stable operation and control is assured and highly dependable load tests are guaranteed.

Apparatus Example 3

The present apparatus example respectively combines and adopts the Δ-connection for three-phase resistor circuits αb constituted by combining in parallel lower-capacity low-voltage resistor circuits βb of the low-voltage bank LB, and the Y-connection for three-phase resistor circuits αa constituted by combining in parallel lower-capacity high-voltage resistor circuits βa of the high-voltage bank HB. Therefore, respectively suitable structure for the high-voltage bank HB of the aforementioned apparatus example 1 and the low-voltage bank LB of the apparatus example 2 such as the Δ-connection for the low-voltage bank LB and the Y-connection for the high-voltage bank HB.

Method Example 3

For the present method example applied to the aforementioned apparatus example 3, the low-voltage bank LB of the aforementioned method example 2 is operated for the low-voltage bank LB, and for the high-voltage bank HB, the high-voltage bank HB of the aforementioned method example 1 respectively correspond and are operated and manipulated.

So far, the typical apparatus examples and method examples of the present embodiment have been described. However, the present invention is not necessarily limited to the means of the apparatus examples and the methods of the method examples. The present invention can be suitably modified and carried out to the extent that the objects of the present invention can be achieved and the aforementioned effects can be obtained.

The invention claimed is:

1. A dry-type high-voltage load system apparatus having a high-voltage load system circuit for testing a high voltage generator, comprising:
a central breaker arranged for connection to the high voltage generator;
a transformer having an input terminal connected to the central breaker and an output terminal;
a low-voltage bank comprised of:
a first plurality of switches;
a plurality of first lower-capacity configuration banks each being a low-voltage resistor circuit comprised of a plurality of low-voltage three-phase resistor circuits, the first lower-capacity configuration banks each respectively connected to a corresponding one of the first plurality of switches to form first switched bank series circuits, the first switched bank series circuits being connected in parallel to the output terminal of the transformer; and
a high-voltage bank comprised of:
a second plurality of switches;
a plurality of second lower-capacity configuration banks each being a high-voltage resistor circuit comprised of a plurality of high-voltage three-phase resistor circuits, the second lower-capacity configuration banks each respectively connected to a corresponding one of the second plurality of switches to form second switched bank series circuits, the second switched bank series circuits being connected in parallel to the central breaker:
said low-voltage three-phase resistor circuits and said high-voltage three-phase resistor circuits each being comprised of resistor arrays configured for three phases, each of said resistor arrays being comprised of resistor elements connected in a series resistor connections, and the resistor arrays being arranged in a form of at least one of:
a Y-connection of three of the series resistor connections arranged to form an isolated and independent neutral point unconnected neutral points of other Y-connections, and the Y-connection having terminals connected to each of in-phase branch distribution lines of a power cable from the circuit breaker; or
a Δ-connection of three of the series resistor connections arranged with terminals of the Δ-connection connected to each of in-phase branch distribution lines of a power cable from the circuit breaker; and
said resistor elements each comprising:
a cylindrical outer tube made of metal;
electrode rods inserted respectively from both ends of said outer tube;
a resistive heat-generating wire wound spirally and extending between inner ends of the electrode rods inside said outer tube;
an insulating material filling up a space between said resistive heat-generating wire and an internal surface of said outer tube; and
high-voltage proof insulating sleeves extractably encasing and anchored in portions of the metal tube adjacent to the both ends of said outer tube, said high-voltage proof insulating sleeves;
at least one frame box having opposing walls, first and second opposing side openings, and an air blower disposed to direct air flow in a flow direction entering said first side opening and exiting said second side opening, said lower-capacity configuration banks of said low-voltage bank and said high-voltage bank being housed in said at least one frame box;
said lower-capacity configuration banks being respectively distributed in exclusive zones distributed throughout said at least one frame box;
said resistor elements in each of said lower-capacity configuration banks being disposed with the resistor elements, of the respective the resistor arrays, arranged adjacent each other in an array pattern extending in an array direction parallel to said flow direction, the resistor arrays are arranged adjacent each other in a cross array direction orthogonal to the array direction and at center-to-center pitch distance spacing apart the resistor arrays; and the resistor arrays having opposing ends of the resistor elements penetrating the opposing walls of said at least one frame box and being supported by said at least one frame box.

2. The dry-type high-voltage load system apparatus as described in claim 1, wherein:
said at least one frame box is two frame boxes each having the first side opening as a cooling air intake opening and the second side opening as a heated air exhaust opening;
said two frame boxes house said lower-capacity configuration banks of said low-voltage bank and said high-voltage bank, with said lower-capacity configuration banks being respectively distributed in the exclusive zones which are distributed throughout said two frame boxes;
said flow direction and said array direction are oriented vertically; and
the resistor elements of respective ones of the resistor arrays are arranged in a vertical column space, the resistor arrays together forming a vertical multi-column array with opposing ends of the resistor elements penetrating the opposing walls of the two frame boxes which are opposing side walls.

3. The dry-type high-voltage load system apparatus as described in claim 2, wherein said two frame boxes are directly grounded to form a chassis ground.

4. The dry-type high-voltage load system apparatus as described in claim 2, further comprising:
the air blower being two air blowers respectively directing air to the cooling air intake openings of the two frame boxes;

an installation housing having a load room wherein said two frame boxes are installed, said load room having heated air exhaust windows and cooling air intake windows of open/close-types respectively at a top wall side and both lateral wall sides of the load room respectively corresponding to said heated air exhaust openings and said air blowers of said two frame boxes;

the installation housing having an instrument panel room separated from the load room by a partition wall and disposed at one-side of said installation housing, said instrument panel room having a door and an external wall;

said transformer and said switches being provided at an external wall side of the instrument panel room; and said external wall side having a control panel and an instrument panel disposed thereon.

5. The dry-type high-voltage load system apparatus as described in claim 2, further comprising:

an all-weather hermetic container configured to be loaded onto a loading platform of an autotruck, the all-weather hermetic container including, ordered from a front end to a rear end, a control room, an appliance room, and a load room; the load room being separated from the appliance room by a partition wall;

said two frame boxes being installed in the load room and the load room having heated air exhaust windows and cooling air intake windows, each configured to be opened and closed, respectively disposed at a top wall side and both lateral wall sides of the load room, and positioned corresponding to said heated air exhaust openings and said air blower of said two frame boxes;

each of said control room and said appliance room having a door;

said control room including a control panel and an instrument panel; and said appliance room including said transformer and said switches.

6. A dry-type high-voltage load system apparatus as described in claim 1 wherein:

said opposing walls are configured as supporters for the resistor elements in a form of arrangement boards;

the opposing walls of said at least one frame box are opposing side walls;

said at least one frame box is of a chassis-ground-type; and said first side opening is a cooling air intake opening and said second side opening is a heated air exhaust opening and are respectively provided at a bottom and a top of the at least one frame box.

7. The dry-type high-voltage load system apparatus as described in claim 6, wherein:

said arrangement boards have circular holding holes each having a dimension allowing said high-voltage proof insulating sleeve to extractably penetrate the holding holes in a horizontal direction; and said arrangement boards support said resistor elements via said voltage proof insulating sleeve at positions successively alternating, as progressing in the array direction, by an offset in the cross array direction corresponding to half of a spacing distance of the resistor arrays in the cross array direction.

8. The dry-type high-voltage load system apparatus as described in claim 7, wherein:

each of said resistor elements is penetratingly bridged through corresponding ones of said holding holes which open on opposing sides of said arrangement boards;

said high-voltage proof insulating sleeves are removably anchored to said holding holes by spring retaining rings, and the spring retaining rings are configured to be removable and the high-voltage proof insulating sleeves and the resistor elements contained therein are configured to be removable from the holding hole with the spring retaining rings removed.

9. The dry-type high-voltage load system apparatus as described in claim 1, wherein:

said at least one frame box is a frame box having the first side opening as a cooling air intake opening and the second side opening as a heated air exhaust opening;

said frame box houses said lower-capacity configuration banks of said low-voltage bank and said high-voltage bank, with said lower-capacity configuration banks being respectively distributed in the exclusive zones which are distributed throughout said frame box;

said flow direction and said array direction are oriented horizontally; and the resistor elements of respective ones of the resistor arrays are arranged in a horizontal row space, the resistor arrays together forming a horizontal multi-row array with opposing ends of the resistor elements penetrating the opposing walls of the frame box which are opposing side walls.

10. The dry-type high-voltage load system apparatus as described in claim 9, wherein said frame box is directly grounded to form a chassis ground.

11. The dry-type high-voltage load system apparatus as described in claim 9, further comprising:

the air blower directing air to the cooling air intake opening of the frame box;

an installation housing having a load room wherein said frame box is installed, said load room having a heated air exhaust window and cooling air intake windows respectively at an end wall side and both lateral wall sides of the load room respectively corresponding to said heated air exhaust openings and said air blower of said frame box, said heated air exhaust window and cooling air intake windows being of a shuttered type configuration arranged to open and close;

the installation housing having an instrument panel room separated from the load room by a partition wall and disposed at one-side of said installation housing, said instrument panel room having upper and lower compartments;

said lower compartment housing said transformer and said switches; and said upper compartment housing a control panel and an instrument panel.

12. The dry-type high-voltage load system apparatus as described in claim 9, further comprising:

an all-weather hermetic container configured to be loaded onto a loading platform of an autotruck, said all-weather hermetic container including a load room wherein said frame box is installed, said load room having a heated air exhaust window and cooling air intake windows respectively at a whole rear wall side and both lateral wall sides of the load room respectively corresponding to said heated air exhaust opening and said air blower of said frame box, said heated air exhaust window and cooling air intake windows being of a shuttered type configuration arranged to open and close;

a control room, the load room being separated from the control room by a partition wall;

said control room having a door and including a control panel, an instrument panel, said transformer, and said switches.

13. A dry-type high-voltage load system apparatus as described in claim 1 wherein:
said opposing walls are configured as supporters for the resistor elements in a form of arrangement boards;
the opposing walls of said frame box are opposing side walls;
said frame box is of a chassis-ground-type; and
said first side opening is a cooling air intake opening and said second side opening is a heated air exhaust opening and are arranged along a horizontal direction with respect to each other.

14. The dry-type high-voltage load system apparatus as described in claim 13, wherein:
said arrangement boards have circular holding holes each having a dimension allowing said high-voltage proof insulating sleeve to extractably penetrate the holding holes in a horizontal direction; and
said arrangement boards support said resistor elements via said voltage proof insulating sleeve at positions successively alternating, as progressing in the array direction, by an offset in the cross array direction corresponding to half of a spacing distance of the resistor arrays in the cross array direction.

15. The dry-type high-voltage load system apparatus as described in claim 14, wherein:
each of said resistor elements is penetratingly bridged through corresponding ones of said holding holes which open on opposing sides of said arrangement boards; and
said high-voltage proof insulating sleeves are removably anchored to said holding holes by spring retaining rings, and the spring retaining rings are configured to be removable and the high-voltage proof insulating sleeves and the resistor elements contained therein are configured to be removable from the holding hole with the spring retaining rings removed.

16. A method of preventing chain breaking and arc discharge of a dry-type high-voltage load system apparatus for testing a high voltage generator which comprises:
a central breaker arranged for connection to the high voltage generator;
a transformer having an input terminal connected to the central breaker and an output terminal;
a low-voltage bank comprised of:
a first plurality of switches;
a plurality of first lower-capacity configuration banks each being a low-voltage resistor circuit comprised of a plurality of low-voltage three-phase resistor circuits, the first lower-capacity configuration banks each respectively connected to a corresponding one of the first plurality of switches to form first switched bank series circuits, the first switched bank series circuits being connected in parallel to the output terminal of the transformer; and
a high-voltage bank comprised of:
a second plurality of switches;
a plurality of second lower-capacity configuration banks each being a high-voltage resistor circuit comprised of a plurality of high-voltage three-phase resistor circuits, the second lower-capacity configuration banks each respectively connected to a corresponding one of the second plurality of switches to form second switched bank series circuits, the second switched bank series circuits being connected in parallel to the central breaker:
said low-voltage three-phase resistor circuits and said high-voltage three-phase resistor circuits each being comprised of resistor arrays configured for three phases, each of said resistor arrays being comprised of resistor elements connected in a series resistor connections, and the resistor arrays being arranged in a form of at least one of:
a Y-connection of three of the series resistor connections arranged to form an isolated and independent neutral point unconnected neutral points of other Y-connections, and the Y-connection having terminals connected to each of in-phase branch distribution lines of a power cable from the circuit breaker; or
a Δ-connection of three of the series resistor connections arranged with terminals of the Δ-connection connected to each of in-phase branch distribution lines of a power cable from the circuit breaker; and
said resistor elements each comprising:
a cylindrical outer tube made of metal;
electrode rods inserted respectively from both ends of said outer tube;
a resistive heat-generating wire wound spirally and extending between inner ends of the electrode rods inside said outer tube;
an insulating material filling up a space between said resistive heat-generating wire and an internal surface of said outer tube; and
high-voltage proof insulating sleeves extractably encasing and anchored in portions of the metal tube adjacent to the both ends of said outer tube, said high-voltage proof insulating sleeves;
the method comprising:
providing supporters as opposing arrangement boards on both sides of a frame box;
disposing said resistor elements within said frame box with said both ends of the resistor elements penetrating said opposing arrangement boards such that said resistor elements bridge said arrangement boards; and
positioning said resistor elements alternately at equal intervals in vertical multiple columns or horizontal multiple stages so that the adjoining columns or stages are staggered so as to be offset relative adjacent ones of said columns or stages in a respective one of a vertical direction along said vertical multiple columns or a horizontal direction along said horizontal multiple stages.

* * * * *